US010392118B1

(12) United States Patent
D'Angelo, Jr.

(10) Patent No.: US 10,392,118 B1
(45) Date of Patent: Aug. 27, 2019

(54) CONDUCTIVE NETWORK FOR PARACHUTE FABRICS

(71) Applicant: Joseph John D'Angelo, Jr., Beavercreek, OH (US)

(72) Inventor: Joseph John D'Angelo, Jr., Beavercreek, OH (US)

( * ) Notice: Subject to any disclaimer, the term of this patent is extended or adjusted under 35 U.S.C. 154(b) by 0 days.

(21) Appl. No.: 16/157,234

(22) Filed: Oct. 11, 2018

Related U.S. Application Data

(63) Continuation of application No. 15/972,182, filed on May 6, 2018, now Pat. No. 10,131,436, which is a continuation of application No. 15/582,686, filed on Apr. 29, 2017, now Pat. No. 9,988,154.

(60) Provisional application No. 62/330,347, filed on May 2, 2016.

(51) Int. Cl.
*B64D 17/02* (2006.01)
*H05K 9/00* (2006.01)

(52) U.S. Cl.
CPC .......... *B64D 17/02* (2013.01); *H05K 9/0088* (2013.01)

(58) Field of Classification Search
None
See application file for complete search history.

(56) References Cited

U.S. PATENT DOCUMENTS

| 4,975,317 | A * | 12/1990 | Kuhn | D06M 11/28 |
| | | | | 427/389.9 |
| 6,146,351 | A * | 11/2000 | Kempe | A61F 13/0273 |
| | | | | 128/846 |
| 2004/0051082 | A1 * | 3/2004 | Child | C09K 3/16 |
| | | | | 252/500 |
| 2012/0285737 | A1 * | 11/2012 | Judy | H05K 9/0043 |
| | | | | 174/381 |
| 2013/0277101 | A1 * | 10/2013 | Judy | H05K 9/0043 |
| | | | | 174/378 |
| 2014/0220845 | A1 * | 8/2014 | Elder | B32B 5/08 |
| | | | | 442/198 |
| 2014/0340877 | A1 * | 11/2014 | Nelson | F21V 33/0008 |
| | | | | 362/103 |
| 2017/0229692 | A1 * | 8/2017 | Thiel | H01L 31/048 |

* cited by examiner

Primary Examiner — Richard G Davis

(57) ABSTRACT

An apparatus comprising a conductive network and one or more Faraday cages, wherein the one or more Faraday cages and conductive network are configured to integrate with a parachute and be packed, deployed, and recovered without damaging the parachute, one or more Faraday cages, or conductive network. A system comprising a conductive network and one or more Faraday cages, wherein the one or more Faraday cages and conductive network are configured to integrate with a parachute and be packed, deployed, and recovered without damaging the parachute, one or more Faraday cages, or conductive network. A method comprising arranging one or more Faraday cages to at least partially shield a conductive network, wherein the one or more flexible Faraday cages and conductive network are configured to integrate with a parachute and be packed, deployed, and recovered without damaging the parachute, one or more Faraday cages or conductive network.

20 Claims, 17 Drawing Sheets

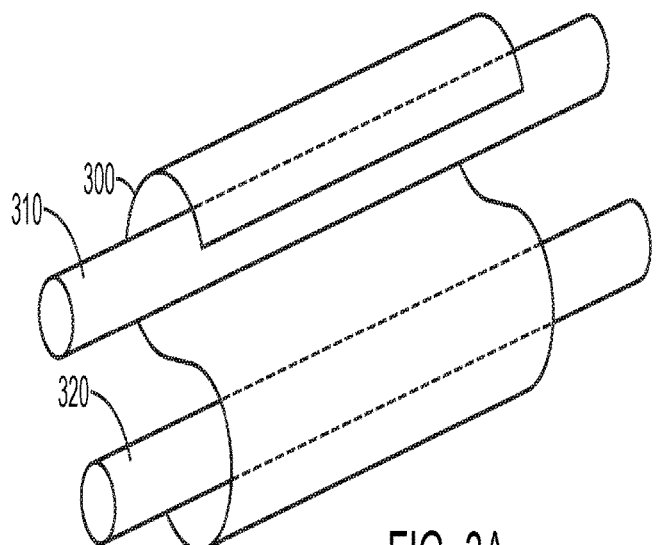
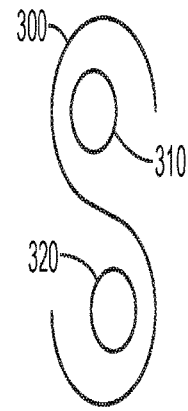
FIG. 3A
FIG. 3B
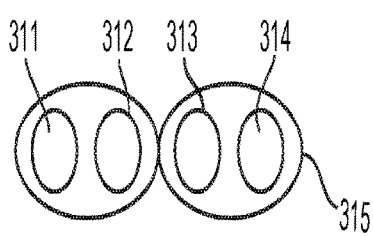
FIG. 3C
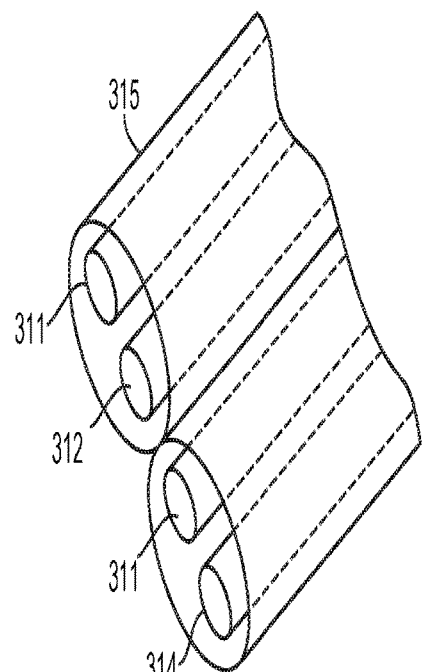
FIG. 3D

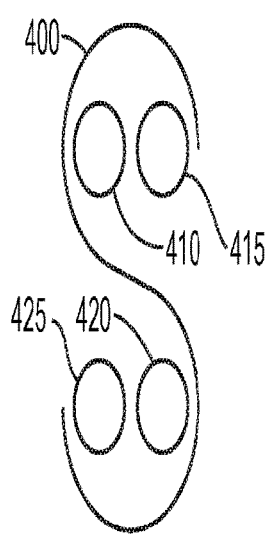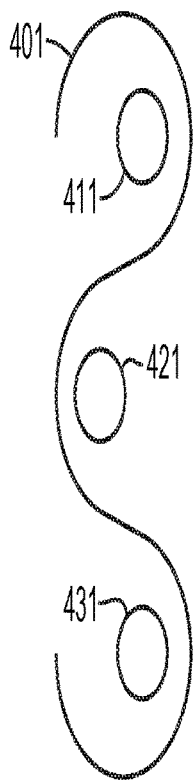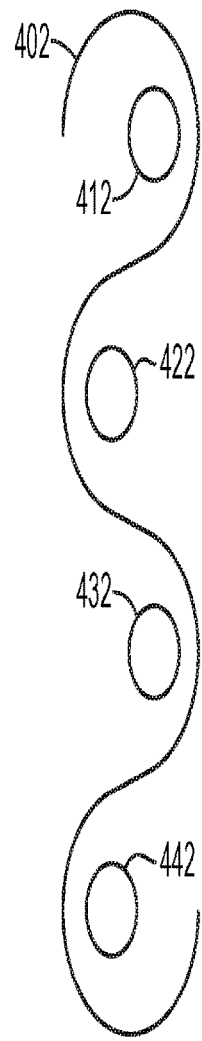
FIG. 4A
FIG. 4B
FIG. 4C

CONDUCTIVE NETWORK FOR PARACHUTE FABRICS

RELATED APPLICATIONS

This application is a continuation of and claims priority to U.S. Pat. No. 10,131,436 titled "Conductive network for parachute fabrics" and filed on May 6, 2018, which is a continuation of and claims priority to U.S. Pat. No. 9,988,154 titled "Conductive network for fabrics" and filed on Apr. 29, 2017, which claims priority to U.S. Provisional Patent Application No. 62/330,347 titled "Conductive Networks for Parachute Fabrics" filed on May 2, 2016 all of which are hereby incorporated in their entirety herein by reference for all purposes.

BACKGROUND

Generally, it has not been possible to establish conductive networks in high static environments. For example, to date, parachute manufactures have been unable to deploy sensor and communication platforms by integrating conductive networks into a parachute fabric design and canopy manufacture. This real-world demonstration of such an integration or deployment has not successfully been achieved.

SUMMARY

In a first embodiment, an apparatus comprising a conductive network: wherein the conductive network includes a set of flexible conductive elements; wherein the set includes a first flexible conductive element: wherein at least a portion of the first flexible conductive element is enclosed within an insulator; and one or more Faraday cages; wherein the one or more Faraday cages are enabled to be arranged to shield at least a portion of the conductive network; wherein the one or more Faraday cages and conductive network are enabled to integrate with a parachute to enable the conductive network and parachute to be packed, deployed, and recovered without damaging the parachute, one or more Faraday cages, or conductive network.

In a second embodiment, a system comprising a conductive network; wherein the conductive network includes a set of flexible conductive elements; wherein the set includes a first flexible conductive element: wherein at least a portion of the first flexible conductive element is enclosed within an insulator; and one or more Faraday cages; wherein the one or more Faraday cages are enabled to be arranged to shield at least a portion of the conductive network: wherein the one or more Faraday cages and conductive network are enabled to integrate with a parachute to enable the conductive network and parachute to be packed, deployed, and recovered without damaging the parachute, one or more Faraday cages, or conductive network.

In third embodiment, a method comprising arranging one or more Faraday cages to at least partially shield a conductive network; wherein the conductive network includes a set of flexible conductive elements; wherein the set includes a first flexible conductive element where at least a portion of the first flexible conductive element is enclosed within an insulator; wherein the one or more flexible Faraday cages and conductive network are configured to integrate with a parachute to enable the conductive network and parachute to be packed, deployed, and recovered without damaging the parachute, one or more Faraday cages or conductive network.

BRIEF DESCRIPTION OF THE DRAWINGS

Objects, features, and advantages of embodiments disclosed herein may be better understood by referring to the following description in conjunction with the accompanying drawings. The drawings are not meant to limit the scope of the claims included herewith. For clarity, not every element may be labeled in every figure. The drawings are not necessarily to scale, emphasis instead being placed upon illustrating embodiments, principles, and concepts. Thus, features and advantages of the present disclosure will become more apparent from the following detailed description of exemplary embodiments thereof taking in conjunction with the accompany drawings in which:

FIG. 3a is a simplified illustration of a piece of conductive fabric wrapped into a "S" shape to form two compartments separating one or more conductive elements in each compartment, in accordance with an embodiment of the current disclosure;

FIG. 3b is an alternative view of the simplified illustration of a piece of conductive fabric wrapped into a "S" shape to form two compartments separating one or more conductive elements in each compartment, in accordance with an embodiment of the current disclosure;

FIG. 3c is a view of the simplified illustration of a piece of conductive fabric wrapped into a "S" shape to form two compartments separating one or more conductive elements in each compartment which has been flattened, in accordance with an embodiment of the current disclosure;

FIG. 3d is an alternative view of the simplified illustration of FIG. 3c, in accordance with an embodiment of the current disclosure;

FIG. 4a is a simplified illustration of a piece of conductive fabric wrapped into a "S" shape to form two compartments separating two conductive elements in each compartment, in accordance with an embodiment of the current disclosure;

FIG. 4b is a simplified illustration of a piece of conductive fabric wrapped into a shape to form three compartments separating one or more conductive elements in each compartment, in accordance with an embodiment of the current disclosure;

FIG. 4c is a simplified illustration of a piece of conductive fabric wrapped into a shape to form four compartments separating one or more conductive elements in each compartment, in accordance with an embodiment of the current disclosure;

DETAILED DESCRIPTION

Figure 1A:
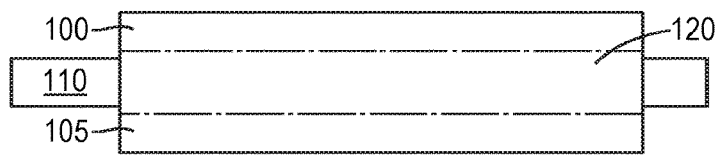
FIG. 1a is a simplified illustration of a parachute fabric with a seam and stitches and one or more conductors inserted into the seam, in accordance with an embodiment of the current disclosure.

Previously, successful attachment and integration of an autonomous sensor system contained on a parachute had not been successfully accomplished. Conventionally, high static environments have caused trouble for conductive networks.

Conventionally, previous networks for parachutes either failed due to packing of the parachute, static electricity, or problems associated with the use and or folding of the parachute. Previously, discrete conductive networks could not be feasibly incorporated into the fabric weave if the fabric is subsequently processes through rollers (calendering), high caustic chemical washes, or other processes where the conductor could be chemically or mechanically altered or the dimension differences between the conductor and the fabric thread lead to damage to the equipment, threads or conductors.

According to NASA the static charge build up on a parachute surface is nominally 25,000 volts. In many embodiments, use of Faraday cage may prevent a static discharge event from of destroying sensors in a conductive network. In some embodiments, a charge on a Faraday cage may dissipated either through a discharge lead or through the grounding of the payload of a parachute upon landing. Typically, the force exerted on a parachute during opening can be nominally between 3 Gs and 9 Gs with extreme/hazardous cases up to 12 Gs. Generally, the force during packing is significant in order to pack the folded parachute into a small packing container. Conventionally, packing includes pounding and sitting on the parachute to fit the parachute into a packing container. In many embodiments, securely attaching a conductive network to a parachute may enable a conductive network to survive packing and deployment. In most embodiments, strategically placing sensors to reduce the amount of shock to which they are subjected may also help ensure survivability in packing and deployment. In certain embodiments, packing a parachute fabric so it acts as a cushioning media may also help survivability during packing and deployment. The Unites States Army recognized the inability to create conductive networks on parachutes in the Small Business Innovation (SBIR) Research Topic A151-063, Conductive Networks for Parachute Fabrics. This SBIR recognized that there had been a failure to create a conductive network on a parachute and that there is a need for such a technology. The United States Army, in awarding a Phase II SBIR to the inventor (Principal Investigator) listed on this application has recognized success of the techniques of the instant disclosure in providing a functioning conductive network. Further, generally parachute manufacturers believed a conductive network, with sensors, attached to a canopy was not possible.

Embodiments of the current disclosure provide a tested and proven solution to creating a conductive network on a parachute. Further embodiments of the current disclosure, enable connecting a network to a high static environment. Many embodiments of the current disclosure enable a conductive network on a material, such as cloth, that is able to withstand repeated folding and unfolding of the material in addition to large amounts of static discharge and other Electromagnetic Interference (EMI). In certain embodiments the electrical network may have various bus configurations: I²C, SPI, CAN bus, differential I²C, three wire. As used herein, I²C may mean Inter-Integrated Circuit. As used herein, SPI may mean Serial Peripheral Interface. As used herein, CAN bus may mean Controller Area Network.

In certain embodiments, the current disclosure may enable a conductive network for a parachute. In some embodiments, the current disclosure may enable a process to incorporate a conductive network onto parachutes without harming the parachute fabric or sensors of a conductive network. In most embodiments, the current disclosure may not inhibit functionality of the parachute. In most embodiments, the current disclosure may enable sustaining parachute packing, and deployment sequence of parachute drop, opening, descent and landing, where the parachute has a conductive network.

In some embodiments, the current disclosure may enable integration and deployment of sensor and communication. In certain embodiments, the current disclosure may enable a Conductive Network for Fabrics. In many embodiments, the current disclosure may enable conductor and network selection. In some embodiments, this disclosure may present a conductive network and associated sensors associated with an embodiment and data associated with such an embodiment which survived multiple drops for which data was collected.

In certain embodiments, the current disclosure may enable a conductive material to be enclosed in a Faraday cage. In some embodiments, a conductive element enclosed in a Faraday cage may be used to create and or protect conductive network on a parachute. In many embodiments, the current disclosure may enable creation of a conductive network on a parachute. In certain embodiments, the current disclosure may enable a robust conductive network on a parachute to withstand packing, rigging, and multiple parachute drops. In many embodiments, the current disclosure may enable a conductive network attached to a parachute that is connected to sensors or other electrical devices. In some embodiments, a conductive network may have one or more stress and tension relief coils.

As used herein, a conductive network may refer to a combination of conductive elements, sensors and other electrical devices. In some embodiments, a conductive element may include wires, conductive material, conductive fabric, conductive threads or conductive yarns. In certain embodiments, conductive networks may consist of conductive elements, such as wires, conductive material, conductive fabric, conductive threads or conductive yarns, interconnections and network branches, conductor attachment methods such as conductive threads, conductive epoxy, solder, mechanical crimps, mechanical compression, Faraday cage elements for shielding such as conductive fabrics, conductive braids, conductive pouches, and may include sensor and microprocessors or microcontrollers and data capture and storage.

In certain embodiments, a conductive element may be a wire or conductive fabric used as a conductor. In many embodiment, a conductor element may be a metalized fiber. In some embodiments, a fabric of a conductive element may be nylon or KEVLAR® or other fiber cores. In at least some embodiments, a conductive fabric may be a metalized fabric. In certain embodiments a conductive fabric may be plated or coated with a metal. In certain embodiments, a base fabric of a conductive fabric may be ripstop nylon. In some embodiments, a device may be an active electrical component. In other embodiments, a device may be a passive electrical component. In many embodiments, a device may be a sensor. In certain embodiments, a device may be an actuator. In some embodiments, a device may be a motor. In further embodiments, a device may be a microprocessor. In certain embodiments, a device may be a microcontroller. In many embodiment, a device may be electrical component. In further embodiments, a device may be an electromechanical component. In some embodiments, an insulator may be nylon fabric. In other embodiments, an insulator may be tape. In certain embodiments, an insulator may be any type of fabrics. In some embodiments, an insulator may be any non-conductive material.

In certain embodiments, a conductive network within a Faraday cage may be preassembled and attached to an internal portion of a parachute fabric. In some embodiments, a network may be attached to the top side of a parachute. In some embodiments, a network may be attached to the bottom side of a parachute. In some embodiments a network may be attached to or inside of a seam of the parachute. In many embodiments, an internal portion of a network may be a seam of a parachute. In some embodiments, a conductive network within a Faraday cage may be preassembled and attached to an external portion of a parachute fabric. In some embodiments, a Faraday cage attached to an external portion of a parachute fabric may be covered by cloth.

In certain embodiments, a conductive network may be attached by adhesives. In other embodiments, a conductive network may be attached by sewing. In further embodiments, a conductive network may be attached by sewing and adhesives. In further embodiments, a conductive network may be attached by double sided tape. In some embodiments, a conductive network may be installed in a seam of a parachute. In certain embodiments, a Faraday cage may be incorporated within a seam of a network. In other embodiments, a Faraday cage may be placed on a seam of a network. In further embodiments, a Faraday cage may be placed on the outside of a network. In some embodiments the conductive network may be interior to the parachute, in a cell or under the top skin. In further embodiments, a Faraday cage may be placed over a seam containing the conductive network.

In many embodiments, a Faraday cage may be may be made from a conductive fabric. In some embodiments, conductive elements may be placed in inside a conductive fabric to create a Faraday cage shielding the conductive elements. In certain embodiments, multiple conductive elements may be placed within the conductive fabric. In further embodiments, a conductive fabric may have be folded into an "S" type shape. In many embodiments, a conductive network may be incorporated into any known seam stitching method. In certain embodiments, two or more conductive elements may be included in each seam pocket.

In some embodiments, conductive fabric may be added to as part seam of a parachute. In many embodiments, a conductive fabric may enable a conductive network or conductive element to cross the seam of the parachute. In certain embodiments, a pouch may be attached to a parachute. In some embodiments, a pouch may be inserted into a parachute. In many embodiments, a conductive fabric pouch may be part of a conductive network. In certain embodiments, a pouch may be made out of a conductive material. In some embodiments, a pouch may be made out of a conductive fabric. In some embodiments, the pouch may be made out of non-conductive material. In some embodiments, the pouch may be made out of non-conductive material and covered with a conductive material or conductive coating. In other embodiments, the pouch may be made out of a conductive material.

In certain embodiments, a conductive network may be preassembled within a Faraday cage and attached to an external parachute fabric surface. In certain embodiments, a conductive network may be preassembled within a Faraday cage and attached internal to parachute fabric surfaces. In some embodiments, a conductive network may be attached by adhesives. In other embodiments, a conductive network may be attached by sewing. In further embodiments, a conductive network may be attached by a combination of adhesives, tape and sewing. In some embodiments, a conductive network may be installed in seams of a parachute. In certain embodiments, a Faraday cage for a conductive network may be incorporated within a seam of a parachute. In others embodiments, a Faraday cage for a conductive network may be incorporated on the external surface of the seam.

In many embodiments, a conductive network may maintain continuity through parachute seams. In certain embodiments, a conductive network may maintain continuity over parachute seams. In some embodiments, a conductive network may maintain continuity though seam stitches. In many embodiments, an incorporated sensor may attach to the network through direct soldering the interconnections. In other embodiments, sensors or electrical components may attach to the network using mechanical interconnects using conductive and nonconductive threads. In further embodiments, sensors or electrical components may attach to the network using conductive tape. In other embodiments, sensors or electrical components may attach to the network using crimp connections. In some embodiments, sensors or electrical components may connect to the network using conductive epoxy and by tying and knotting conductive fibers. In some embodiments, sensors or electrical components may connect to the network using electrical connectors.

In certain embodiments, a network may be autonomous with sensors, power supply, electrical components and memory for data collection. In some embodiments, a system may incorporate a communication system with other networks attached to the parachute or payload or ground stations. In other embodiments, sensors or electrical components may be installed inline within the conductive network, in Faraday cage pockets or in non-Faraday cage configurations. In certain embodiments, a sensor or electrical components may be used to sense physical changes to the parachute surfaces, structure, and surrounding atmosphere. In many embodiments one or more strain relief mechanisms may be included for matching or compensating for different elongation properties of the parachute material. In some embodiments, a conductive network may include strain relief loops. In other embodiments, a conductive network may include zigzag conductor paths for stretching. In some embodiments, a conductive network may include a conductor sliding within a Faraday cage. In some embodiments, a conductive network and Faraday cage which encloses the network may slide as a unit on the surface of a parachute and contained by parachute fabric.

In certain embodiments, optimal performance and reliability may require a Faraday cage to protect from high electrostatic discharge caused by the charge buildup on the parachute material during parachute pack and deployment operations. In some embodiments, a conductive network may be assembled on the parachute or preassembled. In many embodiments, a Faraday cage may be any conductive material. In certain embodiments, a Faraday cage may be a conductive fabric. In certain embodiments, a Faraday cage may be a tape shielding which can provide an electrical shield around the conductors. In certain embodiments, the Faraday cage may be made from conductive nanoparticle material. In certain embodiments, the nanoparticle material may enclose the conductive network. In certain embodiments, the nanomaterial may be adhered directly to the parachute fabric. In certain embodiments, the nanomaterial may fully enclose the conductive network.

In some embodiments, external attachment of a conductive network may include attachment of a complete network assembly—conductive network, sensors, power and memory, or electrical components and communication, which may be enclosed in a Faraday cage. In many embodiments, a network may be adhered and may be sewn to a parachute surface and enclosed by strips of parachute fabric which are adhered/sewn to the parachute surface. In certain embodiments, a network may include pouches for external accessibility.

In some embodiments, an electrical conductive network may be included in seams of an assembled parachute. In certain embodiments, an electrical conductive network may be attached on the surface of a parachute, on the underside inner surface of the top skin of a parachute and/or on the vertical baffles within the parachute. Embodiments of the disclosure may be applicable to any type parachute such as round, rectangular, elliptical and ram a1r configurations. In certain embodiments, a network may be applicable to any parachute fabric material, surface treatment and permeability. Embodiments of the disclosure may be applicable to personnel and payload airdrop parachutes and in principle is applicable to space recovery vehicle parachutes. In certain embodiments, a conductive network may also be installed during parachute manufacture as discrete components or as a kit. In some embodiments, a conductive network may be a conductive thread coated with insulating material and a conductive material. In some embodiments, a conductive material may be silver. In other embodiments, a conductive material may be nickel. In further embodiments, a conductive material may be a combination of nickel and silver. In some embodiments, a conductive material may be or include copper. In certain embodiments, a conductive material may be a nylon thread coated with a conductive material. In many embodiments, a Kevlar thread may be coated with a conductive material. In certain embodiments, a conductive material may be a non-conducting thread coated with a conductive material. In many embodiments, a polymer thread may be coated with a conductive material.

In some embodiments, sensors may be attached to the conductive network of a parachute. In certain embodiments, a sensor may be a navigation aid, Inertia measurement unit, gyroscope, accelerometer, pressure, temperature, magnetometer, GPS or other types of sensors. In certain embodiments, conductor count may be any number which can be enclosed in the Faraday cage. In many embodiments, a network in some cases may be installed in a parachute without a Faraday cage. In some embodiments, a topology of a network may be Inter-Integrated Circuit (I2C), three wire, two wire, Serial Peripheral Interface (SPI), Can bus, differential I2C or other configurations.

In some embodiments, electromechanical devices may be attached to a conductive network of a parachute. In certain embodiments, an electromechanical device may be an actuator or motor.

In certain embodiments, the current disclosure may enable integration of an electro-textile conductive network by embedding it into the parachute canopy to enable data and power transport to sensors and actuators. In some embodiments, the current disclosure may enable integration of a conductive network into a parachute fabric for use in parachute applications. In a particular embodiment, the current disclosure may enable integration into a PIA-C-44378 Type IV, zero porosity and other type of parachute fabric. In many embodiments, a parachute fabric may have zero porosity. In many embodiments, a parachute fabric may have non-zero porosity. In many embodiments, a parachute fabric may be coated with antistatic or silicon or other material. In many embodiments, a parachute fabric may be coated with other materials. In some embodiments, a parachute fabric may not have special coatings.

In certain embodiments, the current disclosure illustrates conductor and network construction. In many embodiments, the current disclosure shows configuration and termination of a conductive network. In some embodiments, the current disclosure illustrates network orientation in a parachute. In further embodiments, it is shown how a conductive network survives mechanical and electrical testing, verification and validation. In certain embodiments, a primary candidate for conductor network design may be Aracon. In some embodiments, Aracon may be placed inside a Faraday's cage. In many embodiments, Aracon may be used to carry signals and power. In other embodiments, a metalized polymer fiber or thread may be used for the conductive network.

In certain embodiments, a primary candidate for conductive network design may enable interconnection methods. In some embodiments, interconnection methods may include soldering. In other embodiments, interconnection methods may include mechanical connections. In further embodiments, interconnection methods may include crimping. In further embodiments, interconnection methods may include conductive tape. In further embodiments, interconnection methods may include conductive epoxy.

In some embodiments, the current disclosure may have an integrated network utilizing $I^2C$ based sensors. In some embodiments, the current disclosure may use electro-mechanical components in a network. In many embodiments, the current disclosure may enable an in-parachute networks for a ram-air parachute. In certain embodiments, the current disclosure may enable an in-parachute network for an Intruder 360 parachute. In certain embodiments, the current disclosure may enable an in-parachute network for an MC-4 parachute. In many embodiments, the current disclosure may enable an in-parachute networks for a round or square parachute. In certain embodiments, the current disclosure may enable an in-parachute network for a T-11 or T-10 parachute. In certain embodiments, the current disclosure may enable an in-parachute network for other types of parachutes. In a particular embodiment, sensors attached to a network may record data to a memory card or double data rate (DDR) memory. In most embodiments, a sensor network on a parachute according to the current techniques may survive multiple packing and unpacking of the parachute. In certain experiments of some embodiments, a conductive network remained attached, did not cause any visible damage to the parachute, and the sensors collected data during multiple drops.

In certain embodiments, a prototype demonstrated successful integration of a conductive network into parachute fabric and parachute canopies. In many embodiments, intact networks and sensor electronics following multiple drops and successful data collection capabilities are enabled for multiple drop tests of a parachute.

In certain embodiments, the current disclosure may enable a textile based electronic network for use in parachute fabric. In certain embodiments, the current disclosure may enable a textile based electronic network for use in Army parachute fabric. In many embodiments, the current disclosure may enable a textile based electronic network for use in commercial parachute fabric. In many embodiments, the current disclosure may enable a textile based electronic network for use in sport parachute fabric. In most embodiments, a textile based network enabled here in may maintain viability and stability across fabric seams and through repeated deployment and recovery events. In a particular embodiment the current disclosure may enable materials and methods to integrate a conductive network into PIA-C-44378 Type IV and other parachute fabrics.

In many embodiments, the current disclosure may enable deployment of sensor and communication platforms by integrating conductive networks into the parachute fabric design and canopy manufacture. In most embodiments, the current disclosure enables a textile based conductive network. In many embodiments, a textile network may have acceptable continuity across fabric seams. In most embodiments, a textile network may survive multiple refolding, deployments and recovery operations. In most embodiments, a textile network may meet the electrical performance and interconnect requirements for signal, data and power transmission. In many embodiments, the parachute conductive network ground may be grounded to a Faraday cage.

In most embodiments, the current disclosure may enable a textile network that maintains fabric properties when modifying the parachute with a conductive network. In many embodiments, the current disclosure may enable a textile network that ensures a durable and ruggedized network capable of withstanding parachute opening and repeated packing and handling. In most embodiments, the current disclosure may enable a cost effective network in conjunction with unique parachute seams. In most embodiments, the current disclosure considers all conductive network components: conductor, conductive fiber, connectors, interconnections and network attachments/integration.

In some embodiments, the current disclosure may enable design, development, and testing of conductive networks that maintain acceptable continuity across fabric seams and throughout the parachute network. In most embodiments, the current disclosure may enable a network that survives multiple refolding, deployment, and recovery operation. In many embodiments, the current disclosure may meet electrical performance and interconnect requirements for data and power transmission. In certain embodiments, the current disclosure may enable ram air parachute drop test details of the successful verification of initial conductive network designs (network and electronic survivability and successful data collection).

In many embodiments, the current disclosure may cover the following:
1. Conductor Network Design/Development (Components)
2. Interconnections Design Development (Components)
3. Integrated Network Design/Development
4. Network Tests—Electromechanical Conductive Network In certain embodiments, the current disclosure may illustrate test materials and methods to integrate a conductive network into PIA-C-44378 Type IV or any parachute fabric. In certain embodiments, the current disclosure may present a design and development of conductor(s) to meet the voltage, current, signal to noise and EMI requirements for a conductive network in a high static environment.

In many embodiments, the current disclosure may meet the requirements of the Berry Amendment with selected conductors. In some embodiments, discrete conductors may be used as components of the network. In many embodiments, conductive fibers may provide a network of discrete lines through proper sizing of fiber bundles (denier). In some embodiments, fibers may have the current carrying capacity to address multiple power levels, data transmission, and signal to noise (S/N) requirements.

In a particular embodiment, target characteristics for the conductive network include the metrics listed in Table 1:

TABLE 1

| Sample Conductive Network Requirements | |
|---|---|
| Application | Requirements |
| Data | mV - 5 V DC @ 500 mA |
| Power | 25 V DC @ 1 A |
| Actuator | 3 V @ 150 mA and 48 V @ 6000 mA |

In some embodiments, conductor components may include Aracon® brand metal clad fibers from Micro-Coax. In other embodiments, conductor elements may include Shieldex® Conductive Yarns from V Technical Textiles. In some embodiments, emerging conductor products may be used to ensure optimal design for voltage, current, signal to noise, and EMI requirements.

Generally, Aracon® brand metal clad fibers are manufactured by Micro-Coax, Inc. Aracon® fibers are lightweight, flexible, and durable. Usually, Micro-Coax manufactures microwave cables, cable assemblies and metalized DuPont™ KEVLAR®, ARACON® fiber for EMI shielding. In certain embodiments, ARACON® fibers may be braided resulting in a 75% weight reduction versus metal braid. Conventionally, V Technical Textiles Inc. offers a number of products for discrete conductors (Shieldex®) and for shielding metalized fabrics/tapes. In most embodiments, different types of conductive fabrics may be used.

In certain embodiments, wire tensile may use a control of 24 gauge insulated solid copper wire, Shieldex 235/34 2-ply TPU coated conductor strands, Aracon XS0400E-018 Bare Conductor, and Aracon XN0400E-JP-BG Blue PFA Jacket. In some embodiments, a half inch-wide silver coated self-adhesive nylon tape and Aracon XN0400F may be used under a 3 amp load current.

In a particular embodiment, w1res were tested for current carrying and sized into appropriate bundles to improve current carrying capacity. In this embodiment, Shieldex (235/34) required four (4) conductors to meet a 0.5 Amp current carrying capacity. In this particular embodiment, two (2) Aracon bare conductors, single ply successfully carried 1 Amp. In this particular embodiment, Two (2) Aracon 3 ply insulated conductors tested okay for carrying up to 6 Amps. In this particular embodiment, the surface temperature of the conductors was also monitored to determine if the temperature at the desired current level was within the parachute material operating range.

In this particular embodiment, the conclusion from the initial conductor testing is that all samples meet the low current requirements. In this particular embodiment, both Aracon products meet the 1 Amp requirements and the 3 ply insulated Aracon conductors meet the 6 Amp requirement. In this particular embodiment, there was a challenge to deliver sample conductors that meet these current requirements.

Table 2 lists sample embodiments of attachment methods for joining the conductive network to the parachute fabric. In these embodiments, both through and across seam attachments were successfully incorporated.

| | | Embodiments of attachment Methods | |
|---|---|---|---|
| Method | Processing | Original Pros | Original Cons |
| 1. Adhere | Attached the conductive network to the finished fabric using an adhesive | Can be attached to any type parachute Strategic placement | Finished fabric is treated so adhesion may be an issue A hot melt method may be required adding to required processing steps |
| 2. Tape-stitch or adhere tape | Stitch or adhere a tape or shield with conductive fiber attached or enclosed to a gore or finished parachute | Can be attached to any type parachute Strategic placement Handling, stitching procedures and processes are within current manufacturing SOPs EMI protection | Cost Could affect parachute fabric properties. |
| 3. Seam Integration | Run the conductive fiber within the seams | Easy to accomplish, little or no impact to parachute performance transverse seams or exit seam at branch point | Large conductor volume could be an issue Less flexibility of strategic placement of sensors |

In some embodiments, a conductive network may be attached to the surface of a parachute using adhesion. In a particular embodiment, an electro-textile conductive network was adhered to the "zero-porosity" top skin of the Intruder 360 parachute. In this embodiment, the conductive network was applied with a special process of adhesion. In this embodiment, the network is embedded in additional parachute fabric. In alternative embodiments, fabric patches may be sewn to Intruder fabric. In certain embodiments, stitching or adhering tape can be attached to any type parachute and may be strategically placed. In some embodiments, an electro-textile conductive network may be adhered to the underside of "zero-porosity" top skin of the Intruder 360 parachute. In some embodiments, an electro-textile conductive network may be adhered to the baffles of lower surface of the ram air canopy. In some embodiments, an electro-textile conductive network may be adhered to any surface of the canopy of a MC-4 parachute In some embodiments, running conductive fiber within seams may be easy to accomplish, may have little or no impact to parachute performance, may not have to transverse seams, and may exit the seam at branch point. In other embodiments, for some network configurations, a conductor may exit the seam between stitches. In certain embodiments, using the seam as a conduit is a preferred method for the majority of network pathways, especially for parachutes with wide seams. In some embodiments, the conductive network may be installed in a T-11 or other parachute seam.

In certain embodiments, epoxies were evaluated for use in terminating conductor interconnections and to improve conductivity across mechanically conductive surface transitions. In many embodiments, epoxies may be used to terminate conductor interconnections and to improve conductivity across mechanically connected conductive surface to conductive surface transitions. In certain embodiments, soldering methods proved repeatable and reliable for interconnects. In some embodiments, soldering with shrink tubing enables termination between conductors, conductor branches and sensor termination. In certain embodiments, ultrasonic welding may be used for connections.

In some embodiments, conductive tape may be used for crossing seams and may be a viable option for some applications. In certain embodiments, tape strips may be attached to both adjoining parachute sections and when folding the sections the tapes physically touch, thus making a continuous conductor across the seam. In many embodiments, the seam may be stitched and the conductive tape strips are attached to each other.

In a particular embodiment, an inter-integrated circuit ($I^2C$) network scheme may be used with two wire communication with $I^2C$ devices and a two wire power bus for prototype demonstrations. In the particular embodiment, the network is located in the seam and the terminations to the sensors use conductive tape which branches off the network conductors and exit the seams.

In a particular embodiment, there may be several different network designs including conductive tape along a seam, conductive tape through a seam, and shielded conductors inserted directly into a seam. In a particular embodiment, a modular network is attached to the surface of a parachute fabric and may be located anywhere on the parachute. In a particular embodiment, a 30 foot modular $I^2C$ network was attached to an Intruder parachute and dropped three times from an aircraft. In a particular embodiment, the network, parachute, and sensors all survived the drops without any visible mechanical damage or functional electrical failure.

In a particular embodiment, $I^2C$ sensors reviewed for conductive network validation included pressure, acceleration, rotation, and temperature sensors. In a particular embodiment, these sensors proved valuable in validating the network. In a particular embodiment, electrical and mechanical testing of integrated fabric samples was completed. In a particular embodiment, test methods were developed to complete interconnect testing of the Aracon Blue 3-ply wire, seam insertion testing, and seam overlap/pass-through/bypass testing. In some embodiments the network may be two wires connected for serial transmit and receive data transfer. In many embodiments, power conductors may be run parallel to the signal wires or routed through a separate path.

In certain embodiments, stripped wire end may be soldered together. In other embodiments, stripped wire end may be glued together with Chemtronics silver epoxy. In some embodiments, stripped wire ends may be glued together with Creative Materials silver epoxy or other conductive epoxies. In certain embodiments, stripped wire ends may be mechanically crimped with metal ferrule. In alternative embodiments, stripped wire ends may be connected with metalized conductive tape. In further embodiments, wire may be spliced into the cable to simulate I$^2$C drops to individual sensors. In alternative embodiments, cyclic flexure testing for accelerated life cycle testing may be tested.

In some embodiments, I2C drops (interconnections) may be accomplished by soldering leads to network bus lines to connect individual sensors or devices.

In some embodiments, individual wires may be bundled together and wrapped in conductive tape to form an EMI shielded ribbon cable and may be inserted into a seam. In other embodiments, an exposed strip of self-adhesive tape may be used to fasten conductors to parachute fabric. In many embodiments, conductors may be systematically spaced out in order to enhance thermal performance. In certain embodiments, consideration of airflow and effect on thermal performance may be included. In many embodiments, twisted pairs may be bundled inside conductive tape in order to enhance noise immunity.

In many embodiments, seam overlap may be used. In a certain embodiment, sewing over the wires with one stitch over each wire may be used. In other embodiments, sewing over the wires with one stitch over all of the wires (long stitch) may be used. In many embodiments, sewing over the wires with one stitch over multiple wires (two or more long stitches) may be used. In certain embodiments, incorporating a grommet or button hole may be used to allow wires to escape, pass over the seam, and then reenter a seam. In other embodiments, incorporating interconnect wire to conductive tape where the tape passes through the sewn seam may be used. In alternative embodiments, results of test methods to test survivability and maintenance of integrity of EMI shield through the seams/interconnects may be used. In other embodiments, the results of tensile tests of parachute fabric to establish baseline properties may be used.

In a particular embodiment, Fabric strips were mechanically tested following ASTM D5305-11 Standard Test Method Force and Elongation of Textile Fabrics (Strip Method). In a particular embodiment, samples were tested in the warp and fill direction. In a particular embodiment, both fabric only and wire and fabric were tested.

In a particular embodiment, flex testing on conductors to evaluate long term stability and survivability in parachute environments (packing, unpacking, opening, landing) was completed. In a particular embodiment, a cam plate design may allow for zero sliding contact between the pins and the wire. In a particular embodiment, seam thermal testing was completed to verify parachute network integrity even during minimal conductor heating.

In a particular embodiment, one half of a network was integrated into a seam and the other half was attached to the top skin of the parachute. In the particular embodiment, half of the network was fully enclosed in an EMI shield and the other half was not completely shielded. In the particular embodiment, both halves incorporated the same types of sensors for comparison. In the particular embodiment, the integrity of this network was tested before and after packing. In the particular embodiment, the parachute was also dropped and thrown around to investigate basic survivability. In the particular embodiment, the conductor system used in the network was also incorporated into the seam of a Nitro 150 parachute made by Hyper USA. In the particular embodiment, two Aracon insulated conductors were inserted into the seam of a parachute. In the particular embodiment, a test was completed to test to see if any friction burns would occur due to the insulated conductor rubbing against the fabric during a jump (packing, opening, landing). In the particular embodiment, the lines were installed in the bottom skin center cell, one line away from the tail. In the particular embodiment, a taped patch on the parachute was verified to show prefabricated networks attached following production are a viable attachment method. In the particular embodiment, the taped pouch survived the parachute drop/jump with no notable damage. In some embodiments, a portion of the conductive network may be outside the Faraday cage and unshielded. In some embodiments, the sensor is inserted in a Faraday cage. In some embodiments, the sensor is inserted in a non-conductive pouch.

In certain embodiments, the current disclosure may provide a design of conductor(s) to meet the voltage, current, signal to noise and EMI requirements for a conductive network in a high static environment. In some particular embodiments, conductors for a conductive network may be selected based on subject matter expertise, available literature documenting electrical and mechanical performance, availability, and compliance with the Berry Amendment. In some embodiments, conductors were tested against the baseline parachute material (PIA-C-44378 Type IV).

In some embodiments, wire tensile testing documented the breaking force of the wire. In a particular embodiment, wires were tested for current carrying capacity and sized into appropriate bundles to improve current carrying capacity. In a particular embodiment, Shieldex (235/34) required four (4) conductors to meet a 0.5 Amp current carrying capacity. In the particular embodiment, two (2) Aracon bare conductor, single ply successfully carried 1 Amp. In the particular embodiment, two (2) Aracon 3 ply insulated conductors tested okay for carrying up to 6 Amps. In the particular embodiment, samples met the low current requirements. In the particular embodiment, both Aracon products meet the 1 Amp requirements and the 3 ply insulated Aracon conductors meet the 6 Amp requirement. In the particular embodiment, the insulated Aracon, conductor was flexed over 100 times with no indication of conductor resistance changes during the test (resistance verified before and after testing). In some embodiments, surface temperature was monitored to determine if the temperature at the desired current level was within the parachute material operating range. In a particular embodiment, Conductive network temperatures remained at acceptable temperatures. In a particular embodiment, at 6 amps, the insulation surface temperature was approximately 165° F.

In most embodiments, adhesives used in a conductive network survived parachute multiple drops. In many embodiments, conductive tape sewn onto parachute fabric proved acceptable for EMI compatibility. In certain embodiments, stitching or adhering tape may be attached to any type parachute and can be strategically placed. In most embodiments, running the conductive fiber within the seams may be easy to accomplish, had little or no impact to parachute performance, did not require traversing seams, and the conductor was able to exit the seam at branch points. In many embodiments, using a seam as a conduit may be the preferred method for the majority of network pathways, especially for parachutes with wide seams. In almost all embodiments, each attachment methods survived multiple drops and did not visually appear to damage the parachute.

In an embodiment, conductive paths across a seam using conductive fabric/tape may be used for termination. In certain embodiments, interconnect termination may include epoxy. In certain embodiments, interconnect termination may include contact connections. In certain embodiments, interconnect termination may include sewn connections. In certain embodiments, interconnect termination may include solder connections. In certain embodiments, interconnect termination may include crimp connections. In certain embodiments, interconnect termination may include ultrasound connections. In certain embodiments, interconnect termination may include mechanical splice. In certain embodiments, interconnect termination may include mechanical tying or knotting the conductors. In certain embodiments, interconnect termination may include electrical connectors.

In most embodiments, mechanical termination by sewing over conductive fibers to conductive fiber or fabric tape may provide a good interconnect selection. In certain embodiments soldering may be used as a connection point. In many embodiments, Aracon may be used as a conductor. In some embodiments, crimp terminations may be used as a termination. In some embodiments, ultrasound connections may be used for termination. In other embodiments, mechanical splices may be used for termination. In other embodiments, conductive tape may be used for a connection. In some embodiments, conductive tape may be used for termination.

In some embodiments, soldering may be the preferred choice of conductor to conductor and conductor to devices/sensors termination. In other embodiments, crimp connections may be used. In some embodiments soldering directly to the sensor interconnections or breakout board may avoid adding another failure point. In certain embodiments, a determination is based on experience with aviation wiring where cable and harness failure frequently occur near connectors.

In some embodiments, mechanical contact, epoxy, and sewing may be options for conductor to conductive tape interconnections. In certain embodiments, sewing a conductor to the conductive tape may form an electrical connection by compressing the two conductors together. In some embodiments, a mechanical bond may be reinforced using epoxy. In many embodiments, an epoxy application may be more involved—two part epoxy, cure time, cure temperature and epoxy adds thickness and increases the cross section of the bonded area.

In certain embodiments, soldering may be chosen for a conductive network as solder may have a low cost, proven reliability/durability, mechanical strength, the existing workforce knows how to use/repair soldered connections, and there may be no special equipment or supply chain requirements.

In some embodiments, Epoxy and sewing may be considered options for connections to conductive tape. Historically, soldering has proven to be more reliable than crimp connections (it is considered a permanent type repair). In most embodiments, the intent of the conductive network may be to be maintenance free and solder may present the best solution for reliability over the sensor/parachute life.

In some embodiments, Conductive tape may be selected for use between stitches as a prime method for crossing seams. In a particular embodiment, a conductive network was demonstrated using three BlinkM LEDs. In this particular embodiment, this successfully documented the communication of a two wire system with each device, reducing the total number of conductors for the network. In a particular embodiment, two power wires may be run separately in the 2-wire I$^2$C network.

In a particular embodiment, a conductive network path of conductive tape was demonstrated through, into, and pass through of the seam. In a particular embodiment, this was verified by connecting BlinkMs to the conductive tape which passed through and out of the seam. In a particular embodiment, internally, the conductive tape was connected to the Aracon, 2-wire system.

In a particular embodiment, 3-wire systems were verified. In a particular embodiment, for 3-wire systems, the potential limitations for parachute integration may include the physical size (volume) of the wire and the seam in which it is enclosed. In a particular embodiment, limitations caused by physical size may be overcome by attaching the conductive network on top of a seam. In a particular embodiment, smaller gauge Aracon wire or other conductors, adequate for signal wires and smaller currents may be used to further reduce weight. In a particular embodiment, limitations caused by physical size may be overcome by attaching the conductive network on top of a parachute canopy.

In a particular embodiment, conductors may be shielded with conductive nylon tape. In certain embodiments, the conductive tape may directly wrap the wires and/or it may form top and bottom covers over the wires either within or exterior to the seam which houses the conductors. In some particular embodiments, interconnections may be located in pouches or pockets, which may be covered with a conductive fabric or made of conductive fabrics. In some embodiments, shielding exceptions may include magnetometers pressure sensors and RF devices. In some embodiments, shields enclosing the conductors may be connected to the conductive pockets to form a Faraday cage.

In exemplary embodiments, different conductive networks were installed on different types of parachutes and tested. In these embodiments, the makeup of the conductive networks varied as described herein. In these embodiments, the attachment of the networks varied as described herein. In these embodiments, the types of parachutes varied as described herein.

In a particular embodiment, a 30 foot modular I$^2$C sensor (5) network was installed on the top skin of an Intruder ram air parachute, a two sensor SPI network was installed on an Intruder parachute, and an in seam I$^2$C network was installed on a MC-4 parachute. In these particular embodiments, each of these installed networks and parachutes were air dropped and survived.

In a particular embodiment, fabric strip mechanical testing was used to verify integrity and optimize the conductive network. In a particular embodiment, testing indicated that to achieve tension only on the parachute fabric (rather than tension on the conductors), the installation design needed to include wire network strain relief. In a particular embodiment, relief strain was accomplished through a coil loop of wire at the ends of a network. In a particular embodiment, each length of wire requires an excess length to account for the difference in elastic modulus between the aramid base fiber in the Aracon wire and the nylon parachute. In a particular embodiment coiled strain relief are integrated into their parachute demonstrations utilizing additional wire, coiled in pocket type patches. In many embodiments, a coil stress/strain relief system may relieve stress on the entire system—conductors and interconnections.

In some embodiments, the conductive network may be loosely attached to a parachute surface, enclosed and covered by a piece of parachute fabric and allowed to move with parachute elongation.

In a particular embodiment, Flex testing (100 cycles) documented no measurable difference in resistance and no visible damage to the wire jackets using the conductive network techniques described herein. In some embodiments, two wire and four wire seam heating tests also documented successful integration of networks with acceptable parachute fabric temperature ranges.

In a particular embodiment, a conductive network was successfully integrated into parachutes/parachute fabric and in the seam. In a particular embodiment, I²C networks, a 3-wire sensor example, a conductive network through the seam, and a conductive network in the shield were integrated into a parachute.

In many embodiments, live testing of a conductor in the seam of the sports parachute proved successful and no friction burns were noted. In most embodiments, based on conductor placement indicator lines drawn after installation and reviewed after the drop, the conductor did not appear to shift during the drop process.

In certain embodiments, a MC-4 parachute packed and unpacked several times which helped to verify network integrity. In these particular embodiments, the parachute was packed and unpacked and flew in the luggage storage compartment of a commercial plane. In these particular embodiments, during the testing, the team unpacked the parachute and verified functional network operation (through functional sensors) and successful data collection.

In a particular embodiment, integrated prototype systems were fabricated and installed on an MC-4 and Intruder 360 parachute. In a particular embodiment, these conductive networks with sensors were installed on the parachutes and drop tested. In a particular embodiment, post recovery evaluation indicated no damage occurred to the parachute, conductive network, or sensors.

In most embodiments, through a series of mechanical and electrical tests as well as the real world drop testing of parachutes, feasibility of a conductive network integrated into a parachute canopy using the techniques described here were confirmed. In many embodiments, the current disclosure may enable an electronic conductive network to enable a smart parachute.

In many embodiments, sensors and actuators, as part of a conductive network, may improve the precision drop of cargo, optimize paratrooper training, and enhance manned parachute steering capabilities. In some embodiments, the current disclosure may enable the placement of sensor anywhere on a parachute by attaching interconnect devices on a parachute via the conductive network. In most embodiments, the current disclosure may enable integration of electro-textile conductive networks into parachute canopies. In some embodiments the conductive network may be installed on the inner surface.

In certain embodiment, the current disclosure may identify and solve issues with effective shielding, grounding, networks across panels, and demonstrating sufficient flexibility and strength of the network. In many embodiments, a parachute network may not interfere with parachute operations while maintaining electronic integrity of the circuitry. In most embodiments, the current disclosure may enable an electronic conductive network to enable a smart parachute.

In some embodiments, the current disclosure enables conductivity across seams, mechanical and electrical integrity, and survivability during air drops and the effects of parachute packing, deployment, opening, glide, and landing. In certain embodiments, preliminary evaluation of airdrops using conductive network-modified parachutes described herein indicates that the parachutes mechanically survive handling and parachute drop sequences and there was no damage to the parachutes or conductive networks. In these experiments, the electronics (sensors) attached to the conductive networks on the parachutes also survived the pack and deployment operations and functioned after the drop.

In tested embodiments, the networks maintained acceptable continuity across the fabric seam and throughout the parachute network. In the tested embodiments, the network survived multiple packing and unpacking, deployment, and recovery operations. In the tested embodiments, the conductive network also met the Army's electrical performance and interconnect requirements for data and power transmission.

In certain embodiments, the current disclosure enables a functional conductive network by refining the network for full scale incorporation on both round and ram air parachute canopies.

In many embodiments, the current disclosure enables subsystems of a network including networked fabric and LSc-2 seamed prototype(s) in accordance with the objective to integrate electro-textile conductive networks into parachute canopies.

In most embodiments, the current disclosure may enable procedures, components, and techniques to fabricate a network; design modular conductive networks for applications which require the network in a seam and through seams, on the top surface of the canopy and below the top canopy; and conduct laboratory and shop tests to verify survivability and functionality followed by full-scale parachutes deployed from an aircraft in an airdrop environment.

In certain embodiments, a matrix of target characteristics and test sequences of a parachute with electronic conductive network and set targets for conductive network may be shown below.

| Application | Requirements |
| --- | --- |
| Data | mV - 5 V DC @ 500 mA |
| Power | 25 V DC @ 1 A |
| Actuator | 3 V @ 150 mA and 48 V @ 6000 mA |

In certain embodiments, the current disclosure enables a network that may meet the electric current levels specified in the table and enable optimization of network configurations for different network architectures. In many embodiments, a parachute mapping of the network showing the location and termination points may be provided. In certain embodiments, an I²C network with branches for multiple sensors, an SPI network for short distances—microcontroller to sensors, and a three wire sensor conductor run may be presented. In many embodiments, long conductive networks may include signal conditioning circuitry. In many embodiments, a conductive network may include buffers, drivers, booster, or other electronic devices to improve signal integrity and improve signal to noise ratios.

In certain embodiments, representative functional samples of an I²C conductive network in a seam and a modular conductive network for attachment on interior or exterior parachute surfaces are enabled. In a particular example embodiment, the capability to cross panels within the seam of the MC-4 parachute was documented.

In certain embodiments, installation techniques for in-seam conductive networks may be labor intensive and difficult to totally shield (complete Faraday cage). In some embodiments, these techniques may be applied to the MC-4 parachute and may be modified for other parachutes such as the T-11 or other type parachutes.

In some embodiments, a process for fabricating the conductive shield which separates the power and signal conductors may be a manual process. In some embodiments, kitting operations to fabricate modular conductive networks at improved production rates and with consistent quality may be enabled.

In some embodiments, materials used to fabricate the conductive network and sources specifically for shielding the conductors (Faraday cage) may be used and enabled to meet the Berry Amendment or customer specific requirements.

In certain embodiments, data from air drop tests of specific confirmed successful integration of conductive networks (including confirmation of survivability of sensors for multiple drops) using the techniques disclosed herein In a particular embodiment, a pressure sensor as part of the conductive network was attached to an Intruder 360 parachute. In this example embodiment, this sensor survived multiple packings, unpackings, and three aircraft drops (packing, opening, landing, and recovery). In this example embodiment, the sensor and network system collected data during the drop.

In some embodiments, the current disclosure enables methods to ruggedize a sensor system. In certain embodiments, whereas other sensors may be fully enclosed in protective pouches, a pressure sensor may need to be specifically calibrated based on the enclosure used. In most embodiments, pressures sensors may be uncovered and exposed to the same atmospheric pressure that experienced by the parachute fabric.

In some embodiments, methods for attaching/removing sensors to/from the conductive network are presented. In some embodiments, a design may use conductive pouches to hold the sensor, processors and batteries. In certain embodiments, improved attachment methods for pouches and techniques to electrically connect sensors may be presented. In an example embodiment, a pouch may hold network components. In most embodiments, pouches may be attached to the parachute. In other example embodiments, pouches may be made to shield and protect components as necessary.

In a particular example embodiment, a pouch may be used to enclose and hold a conductive network's microcontroller and pressure sensor system. In this example embodiment, this pouch is located underneath the top skin of an Intruder 360. In this example embodiment, a microcontroller is located inside of the pouch and a sensor is attached to the outer edge of the pouch and underneath the top skin of the Intruder 360 (so that it is fully exposed to pressure changes during drops). In this example embodiment, this pouch houses the control system for the pressure sensors on the parachute (both top-side and in-cell).

In a particular embodiment, adhesion of an electro-textile conductive network to the "zero-porosity" top skin of the Intruder 360 may be enabled. In this example embodiment, a conductive network may be applied with a special process of adhesion; the network is embedded in additional parachute fabric. In this example embodiment, the application of this conductive network between fabric minimizes additional weight.

In a particular embodiment, adhesion of an electro-textile conductive network to the top skin of a MC-4 may be enabled. In this example embodiment, a conductive network may be applied with a special process of adhesion; the network is embedded in additional parachute fabric. In this example embodiment, the application of this conductive network between fabrics minimizes additional weight.

In some embodiments, network branches may be solder interconnects and permanent connections. In certain embodiments, sensor connections may depend on the sensors chosen and if the termination points are through hole or SMT or breakout board.

In some embodiments, the current disclosure enables a conductive network and devices attached to the conductive network to survive parachute packing, opening, drop, landing, and recovery. In certain embodiments, a pocket located on the top skin of an Intruder, MC-4 or other parachute may provide a sealed network.

In some embodiments, a complete network and sensors may be enclosed in a conductive shield which forms a Faraday cage.

In certain embodiments, modular harness wiring kits may be used for a conductive network. In some embodiments, a testing fixture for the wiring harness may be used to ascertain continuity, shielding, and confirm that there is no crosstalk or shorts present. In further embodiments, a test fixture may be used after the wiring harness is installed in the parachute to verify that the harness was not damaged during the assembly phase. In some embodiments, a design of a text fixture may be modular to accommodate different numbers of sensor attachment points, different network shape configurations, and various installation paths within the seam during manufacture or on a parachute's skin post manufacture.

In certain embodiments, $I^2C$ networks may be a dominant network configuration since many sensors are $I^2C$ compatible and a large number of $I^2C$ sensors may be attached to the network. In some embodiments five to six $I^2C$ sensors may be a typical network, a number that is well within the capability of $I^2C$ networks. In further embodiments, length may be a consideration with any network. In other embodiments, a 30 foot $I^2C$ network with five sensors attached may be used. In some embodiments, $I^2C$ network configurations may have the capability to attach $I^2C$ devices. In a typical network installation, network integrity, network interrogation and sensor operation may be confirmed through connections to a computer.

In certain embodiments, a GPS may be connected to a microcontroller via a serial connection.

In certain embodiments, SPI Networks may be useful for a number of applications such as pressure measurement where higher sampling speeds are required. In some embodiments, attachment methods may be used to test physical layout for signal integrity. In some embodiments, similar to an $I^2C$ network, the SPI network modular may be modular. In many embodiments, two to three sensors may be attached to SPI networks and the network may be designed with individual controllers and power supplies so that these modules can be attached to any location on/in the parachute. In certain embodiments, this may be a low power network. In some embodiments, one or more wired sensors may be connected to digital and analog inputs/outputs on the microcontroller.

In some embodiments, three wire sensors may not necessarily be networked, but conductors may be channeled or run to anywhere on the parachute that three wire sensors are needed. In some embodiments, three wire sensors may be connected to a microcontroller that is also used for the $I^2C$ network demonstrations. In certain embodiments, this may be a low power network.

In some embodiments, two wire devices may also be attached to installed conductors. In certain embodiments, a flap may have on/off commands and may have a controller to send commands. In many embodiments, an on/off function may be integrated in a network and power to the shape memory alloy actuator may also be run in a power conductor configuration. In some embodiments, a 6 ampere conductor system may be used. In some embodiments, the network may be connected to a motor or actuator.

In some embodiments, during manufacturing of new parachutes the feed through of conductors across seams may be accomplished using conductive tapes. In certain embodiments, this method may be practical when used during new parachute manufacture. In some embodiments, if used during parachute modification it may be necessary to cut stitches, install the tapes and restitch the parachute.

In certain embodiments, there may be numerous prototype parachute variants. In certain embodiments, parachutes may be a combination of new and modified parachutes. In some embodiment, prototypes may include round, square, rectangle, and ram air (MC-4, Intruder, sport) canopies.

In certain embodiments, modular conductive network approach and an adaptation of the modular approach for installing the conductive network in seams may be used. In many embodiments, attaching sensors and microcontrollers may be similar for both methods.

In an embodiment, a modular network may be attached using a fabric strip over a conductive network. In this embodiment, a strip and conductive network may be held to a zero porosity Intruder to skin by an adhesive or sewing. In some embodiments, a modular network may be attached to any type of parachute fabric. In certain embodiments, stitching of the fabric strip may be to the top skin. In a particular embodiment, adhesion to an Intruder parachute after three airdrops indicated good adhesion.

In some embodiments, the conductive network may be fully enclosed in fabric of other material. In some embodiments the enclosing fabric or material may be attached to the parachute surface.

In an embodiment, a small sample snapshot of typical data from the conductive network/sensors located on the top skin of the Intruder 360 is included below. In this embodiment, data collection demonstrates that data may be collected on full-scale parachutes deployed from an aircraft in an airdrop environment. In this embodiment, the actual data downloaded after parachute recovery is representative of data before, during, and after the parachute drop. In this embodiment, the data was collected from a temperature/humidity sensor, an IMU, and two accelerometers. In this embodiment, the network included the sensors, a microprocessor, SD card to collect data, and a battery. In some embodiments, sensors may be calibrated and compared to the payload tracking system.

In some embodiments, a solid state device may be used to capture/save data. In some embodiments an inductive battery charging system may be included.

In some embodiments, the current disclosure may enable terminating, effective shielding, grounding, continuing wires between panels, four panel junctions, demonstrating sufficient flexibility for a conductive network and devices that may not interfere with parachute operations while maintaining electronic integrity of the circuitry.

In certain embodiments, the current disclosure may present techniques that enable
1) Testing and manufacturing prototype parachutes which meet the objectives of the user and the needs of the parachute industry
2) Proven sensor and electronic conductive network attachment methods on a full scale parachute and networks that receive meaningful data from sensors after air drop recovery
3) Document techniques and processes to assemble, install, attach, test, and analyze an electronic conductive network.

In certain embodiments, the current disclosure may enable parachute canopy systems (MC-4, Intruder, T-11, other) which includes electronics in a conductive networks. In some embodiments the sensor data may be retrieved from a solid state memory device. In some embodiments the sensor data may be retrieved from a flash memory device. In some embodiments the sensor data may be retrieved from radio frequency communication between the on board parachute electronics and ground station.

In many embodiments, flexible, high performance, and lightweight conductors for parachute networks may be enabled; embedding conductors into precision fabrics and parachute seams which may be enabled useful for military and commercial cargo parachute markets, paraglider markets, as well as the growing market in e-textiles and smart clothing.

In certain embodiments, the techniques of the current disclosure may be applied to other than parachute networks. In many embodiments, incorporation of the network in the seams may offer tremendous opportunities and further expansion opportunities including putting sensors in clothing, uniforms, and protective equipment. In some embodiments, health monitoring systems and performance enhancing system may be body worn systems. In certain embodiments, worn systems may benefit by incorporating a conductive network. In further embodiments, microclimate clothing such as cooling and or heating garments may benefit from incorporating a conductive network. Further embodiments of conductive networks may be used in FOF (Friend or Foe) identification systems to prevent fratricide, and also in the field of adaptive camouflage, wherein the e-garment blends in with the surrounding area.

Sample Snapshot of Data at Two Different Times from Modular Network after Aircraft Drop

| | | | |
|---|---|---|---|
| | | Time: 3 | |
| Htu2I Temp: 19.22 | | Hum: 14.23 | |
| X: 358.81 Y: 0.00 Z: 1.00 | | CALIBRATION: Sys = O Gyro = O Accel = O Mag = O | |
| | | Temperature = 18.99* C. | |
| | | Pressure = 95933.66 Pa | |
| X1: 0.02 | Y1: 0.16 | Z1: −0.98 | mfs/$\wedge$2 |
| X2: 0.00 | Y2: 0.35 | Z2: 0.93 | mfs/$\wedge$2 |
| | | Time: 11931 | |
| Htu21 Temp: 21.80 | | Hum: 14.32 | |
| X: 359.56 Y: −24.56 Z: 179.25 | | CALIBRATION: Sys = O Gyro = 3 Accel = 3 Mag = 1 | |
| | | Temperature = 24.28* C. | |
| | | Pressure = 79277.34 Pa | |
| X1: 0.42 | Y1: 0.37 | Z1: −0.82 | mfs/$\wedge$2 |
| −n14 | v? · | nm 7? · 0.89 | m/s$\hat{\,}$2 |

In many embodiments, the current disclosure enables the ability to electronically read sensor information anywhere on the parachute in conjunction with the ability to send control signals to motors and actuators located on the parachute. In certain embodiments, the ability to measure parachute characteristics during each stage of deployment may be tremendous in terms of testing and validating current parachute models and refining models with actual data beyond boundary value estimates.

In further embodiments, the current disclosure may enable collection of information (sensored data collection) on the performance of the parachute or parachutist, night parachute lighting, general navigation aids and improved understanding of parachutes from full scale experimental data for the academic and R&D community. In most embodiments, by providing the ability to measure characteristics (pressures, temperatures, accelerations and rotation) anywhere on a parachute, it may be enable the parachute industry with the data analytics and real time performance metrics to improve designs.

In an embodiment, the current disclosure enables modification of parachutes by adding conductive networks to any location on the parachute fabric, i.e., top skin of the canopy, bottom skin of the top canopy, and any other surface. In certain embodiments, the conductive network may include sensors, microcontrollers, and power sources. In many embodiments, a method and processes to incorporate a conductive network on/in a parachute canopy and fabric and connect electronic devices to the network may be presented. Conventionally, there has been no known conductive network comparable to the current disclosure.

In many embodiments, the current disclosure may present techniques to create a parachute with a conductive network to which sensors and possibly actuators may be attached. In most embodiments, the current disclosure enables a network, resistance to EMI, capable of reuse, and able to withstand the packing and deployment operations.

In almost all embodiments, the conductive network of the current disclosure may survive parachute packs and drops. In these embodiments, the sensors performed and survived the drop process. Further, in many embodiments, the current disclosure enabled attachment of an autonomous sensor network to a parachute canopy and collect data. In many embodiments, the current disclosure may allow a conductive network to be tailored to specific requirements. In some embodiments, as a network may be in a parachute seam. In other embodiments, a network may be placed outside a seam. In further embodiments, using the techniques discussed herein, a network may be placed anywhere on the parachute, above or below the top skin and under the canopy.

A particular embodiment of a Parachute Network Design, may have a 30 foot long sections of S-Shaped folder conductive tape or fabric to serve as a conduit for two nominally 22 AWG size wire in each lobe of the S-shaped folds. For this embodiment, a conductive pocket is attached (sewn) on each end with the pocket opening perpendicular or parallel to the length of the section. In this embodiment, five conductive pockets are attached evenly spaced between the ends of the section. In this embodiment, slits are inserted in the section so the two wires from each lobe can enter the pocket without being exposed and without restricting sliding movement of the wires within the lobes.

Figure 1B:
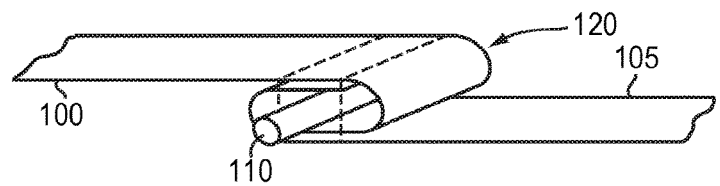
FIG. 1b is an alternative simplified illustration of a parachute fabric with a seam and stitches and one or more conductors inserted into the seam, in accordance with an embodiment of the current disclosure.
Figure 1C:
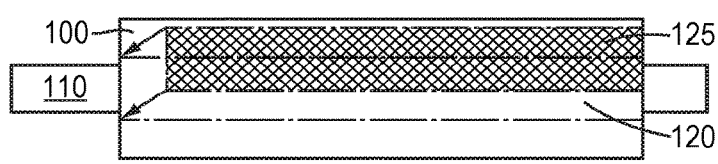
FIG. 1c is a simplified illustration of a Faraday cage being layered over a seam of a parachute, where one or more conductors are in the seam, in accordance with an embodiment of the current disclosure.

Refer now to the example embodiment of FIGS. 1a and 1b, which illustrates a simplified embodiment of a conductive material inside of a seam of a fabric. FIG. 1a illustrates conductive material 110 inside of seam 120 formed by parachute fabric sections 100 and 105. FIG. 1b represents a side view of FIG. 1a. Conductive material 110 is inside of seam 120 formed by fabric sections 100 and 105. The seam is formed by folding the parachute fabric sections and may be folded in a specific patterns for each parachute design. In other embodiments, different types of folds may be used to create a seam.

Figure 1D:
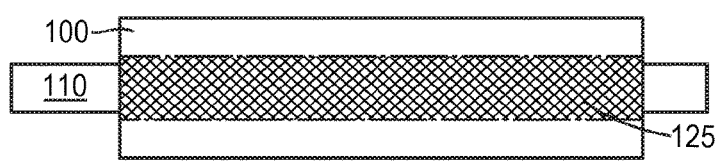
FIG. 1d is a simplified illustration of a Faraday cage layered over a seam of a parachute, where one or more conductors are in the seam, in accordance with an embodiment of the current disclosure.
Figure 1E:
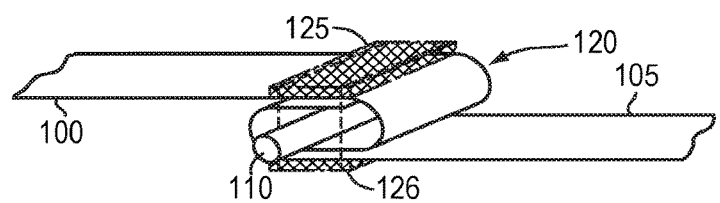
FIG. 1e is an alternative simplified illustration of a Faraday cage layered over a seam of a parachute, where conductors forming a conductive network are in the seam, in accordance with an embodiment of the current disclosure.

Refer now to the example embodiment of FIG. 1e, which illustrates placing a conductive material over a seam. In this example embodiment, conductive fabric 125 is placed on top of seam 120. In this embodiment conductive material 125 may be used to create a Faraday cage protecting conductive material 110 in seam 120.

Refer now to the example embodiments of FIGS. 1d and 1e, which illustrated a conductive material attached to a fabric to cover a seam. Conductive material 125 has been adhered to material 100 to cover seam 120 and conductive material 110. FIG. 1e represents a side view of FIG. 1d. In the Example embodiment of FIG. 1e, conductive material 125 is adhered to the top side of seam 120 to material 100. In the Example embodiment of FIG. 1e, conductive material 126 is adhered to the underside of seam 120 to material 105. In other embodiments, a conductive material may not be adhered to an underside of a seam. In many embodiments, a conductive material may be adhered by any of the aforementioned techniques including but not limited to gluing and sewing.

Figure 1F:
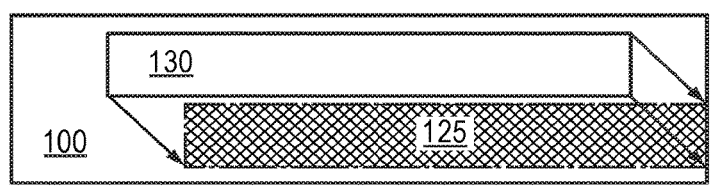
FIG. 1f is a simplified illustration of a piece of parachute fabric being layered over a Faraday cage, which is layered over a seam of a parachute, where one or more conductors are in the seam and branch into a conductive pocket, in accordance with an embodiment of the current disclosure.
Figure 1G:
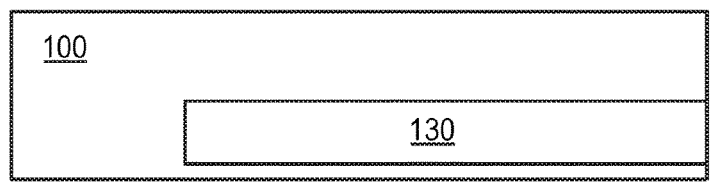
FIG. 1g is a simplified illustration of a piece of parachute fabric layered over a Faraday cage, which is layered over a seam of a parachute, where one or more conductors are in the seam and branch into a conductive pocket, in accordance with an embodiment of the current disclosure.

Refer now to the example embodiments of FIGS. 1f and 1g, which illustrate a material being attached to parachute fabric to cover a conductive material. In the example embodiment of FIGS. 1g and 1f material 130 is attached to fabric 100 to cover conductive material 125. FIG. 1g represents FIG. 1f after the material 130 has been attached to material 100.

Figure 2A:
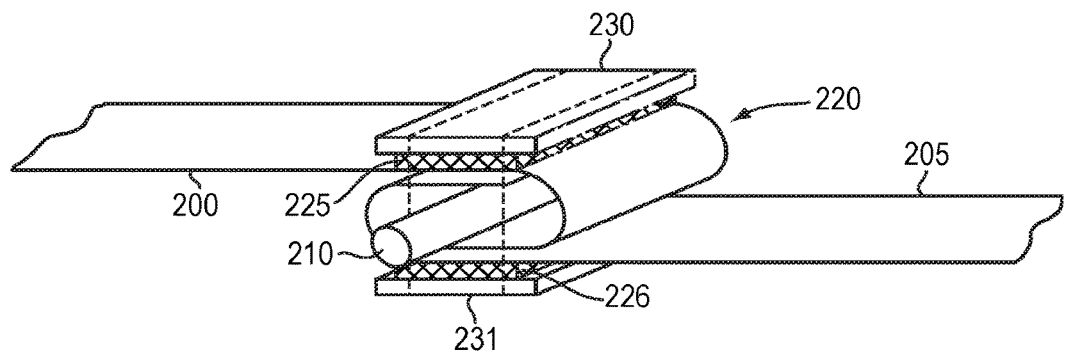
FIG. 2a is a simplified illustration of a piece of parachute fabric layered over a Faraday cage, which is layered over a seam of a parachute, where conductors are in the seam, in accordance with an embodiment of the current disclosure.

Refer now to the example embodiment of FIG. 2a, which illustrates conductive elements enclosed in a Faraday cage. In the example embodiment of FIG. 2, conductive element 210 is in seam 220 formed by material 200 and 205, seam 220 is covered on either side by conductive material 225 and conductive material 226. Conductive material 225 is covered by material 230 and conductive material 226 is covered by material 231.

Figure 2B:
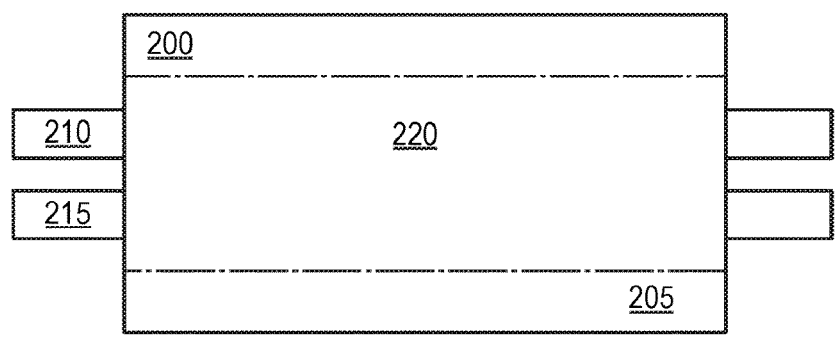
FIG. 2b is an alternative simplified illustration of a piece of parachute fabric over a Faraday cage, which is layered over a seam of a parachute, where one or more conductors are in the seam, in accordance with an embodiment of the current disclosure.

Refer now to the example embodiment of FIG. 2b, which illustrates multiple conductive elements in a seam. In the example embodiment of FIG. 2b, conductive element 210 and conductive element 215 are in seam 220 formed by material 200 and 205.

Refer now to the example embodiments of FIGS. 3a, 3b, 3c, and 3d, which illustrate conductive elements encased in a conductive material. In the example embodiment of FIG. 3a, conductive material 310 and 320 are enclosed in conductive material 300. Conductive material 300 is folded into an "S" shape to provide conductive separation of conductive materials 310 and 320. Conductive material 300 also forms a Faraday cage around conductive materials 310 and 320. FIG. 3b represents a side view of FIG. 3a. FIGS. 3c and 3d represent different views of the flattening of the "S" material. In certain embodiments, there may be multiple conductive elements 311, 312, 313, 314 that are within a fold of a fabric or conductive fabric, 315. In a particular embodiment, conductor 311, 312, 313, 314 may represent two or more conductors. In certain embodiments, once the "S" material is flattened similar to that of FIG. 3c or 3d, the flattened material may be threaded through the seam of another material. In many embodiments, a conductive material threaded through the seam of a material may create a Faraday cage protecting the conductive elements in the folds of the material. In many embodiments, there may be any number of folds providing separation between different conductive elements. In certain embodiments, where a conductive material, such as creating compartments for a conductive material, no further covering may be needed to protect the conductive elements.

Refer now to the example embodiment of FIG. 4a, which illustrates multiple conductive elements in each fold of an "S." In this example embodiment, conductive elements 410 and 415 are contained in the upper portion of material 400 and conductive materials 420 and 425 are contained in the lower portion of material 400. In this example embodiment, each conductive element such as 410, 415, 420, and 425 may be insulted. In other embodiments, any number of conductive elements may be in a fold of a material.

Refer now to the example embodiment of FIG. 4b, which represents multiple folds of a material. In the example embodiment of FIG. 4b, three conductive elements, conductive element 411, conductive element 421, and conductive element 431, are separated by material 401 in different folds. Similar to that of FIGS. 3c and 3d, the material of FIG. 4b may be flattened. Also similar to that of FIG. 3c, the material may be threaded through a seam.

Refer now to the example embodiment of FIG. 4c, which illustrates an alternative embodiment of multiple conductive elements in folds of a conductive material. In this example embodiment, conductive elements 412, 422, 432, and 442, are folded within conductive fabric 402 to form a conductive barrier between the conductive materials. In many embodiments, a conductive material may provide shielding between each conductive element to limit interference between the conductive elements. In many embodiments, conductive elements enclosed in a conductive material may be shielded to withstand substantial electrostatic events without further shielding.

Figure 5A:
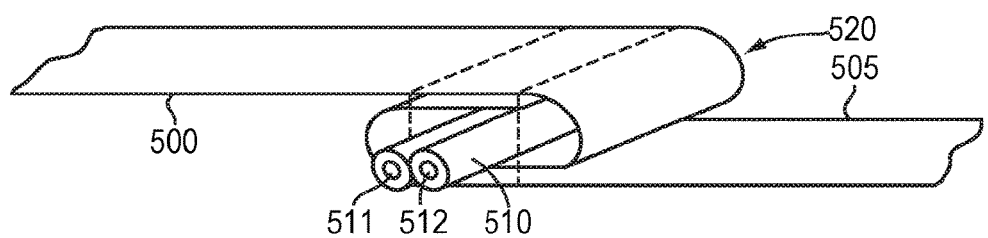
FIG. 5a is a simplified illustration of a piece of conductive fabric wrapped into a shape to form compartments threaded through a seam, in accordance with an embodiment of the current disclosure.

Refer now to the example embodiment of FIG. 5a, which illustrates a conductive material covering conductive elements threaded through a seam. In the example embodiment of FIG. 5, "S" shaped conductive material 510 with conductive elements 511 and 512 is threaded through seam 520 formed from material 500 and 505. In this example embodiment conductive material 510 enclosing conductive elements 511 and 512 needs no further shielding.

Figure 5B:
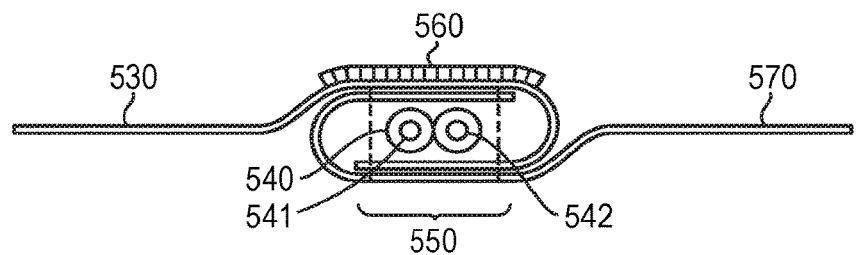
FIG. 5b is a simplified illustration of a piece of conductive fabric wrapped into a shape to form compartments threaded through a seam, where the seam is covered by a conductive fabric, in accordance with an embodiment of the current disclosure.

Refer now to the example embodiment of FIG. 5b, which illustrates a conductive material covering conductive elements threaded through a seam that has been covered with conductive material. In the example embodiment of FIG. 5b, "S" shaped conductive material 540 with conductive elements 541 and 542 is threaded through seam 550 formed from material 530 and 570. In this example embodiment seam 550 is covered by a conductive material 560.

Figure 6A:
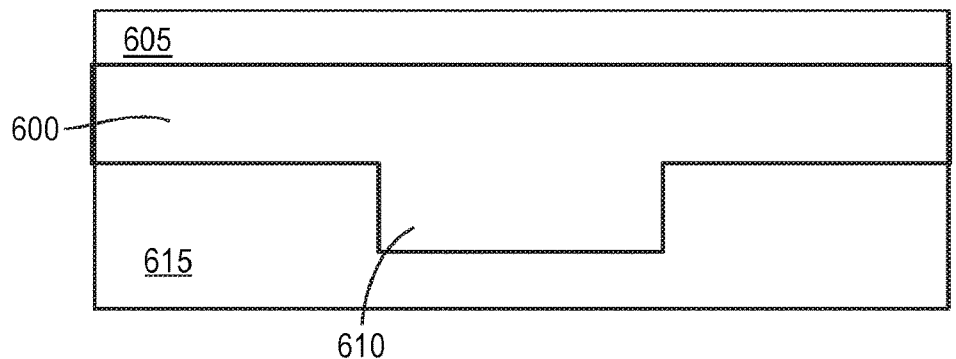
FIG. 6a is a simplified illustration of a pouch off a seam, m accordance with an embodiment of the current disclosure.

Refer now to the example embodiment of FIG. 6a, which illustrate pouch 610 attached to a parachute fabric 615 along the edge of a seam 600. FIG. 6a represents a seam 600 formed by fabric 605 and 615 with pouch 610 attached at the seam 600 edge. In some embodiments, a pouch, such as pouch 610 of FIG. 6a, may be non-conductive. In some embodiments, a pouch, such as pouch 610 of FIG. 6a, may be conductive. In some embodiments, a pouch, such as pouch 610 of FIG. 6a, may be sewn to parachute fabric 615. In some embodiments, a pouch, such as pouch 610 of FIG. 6a, may be glued to the parachute fabric 615. In some embodiments, a pouch, such as pouch 610 of FIG. 6a, may be sewn and glued to parachute fabric 615.

Figure 6B:
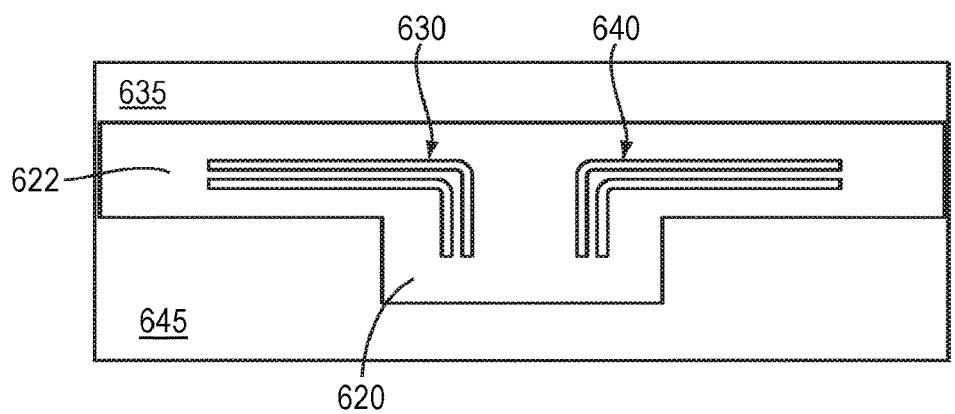
FIG. 6b is a simplified illustration of a pouch off a seam, where conductive elements exit the seam into the pouch and other conductive elements exit the seam, where the seam is covered by a conductive fabric, in accordance with an embodiment of the current disclosure.

The example embodiment of FIG. 6b illustrates conductive network portions 630 and 640 in seam 622 and terminating in the pouch 620. In some embodiments, the conductors 630 and 640 enter pouch 620 from both sides and the conductive elements which they contain are connected to a device in the pouch 620. Seam 622 is formed by two sections of fabric 635 and 645 and pouch 620 is incorporated onto fabric 645.

Figure 6C:
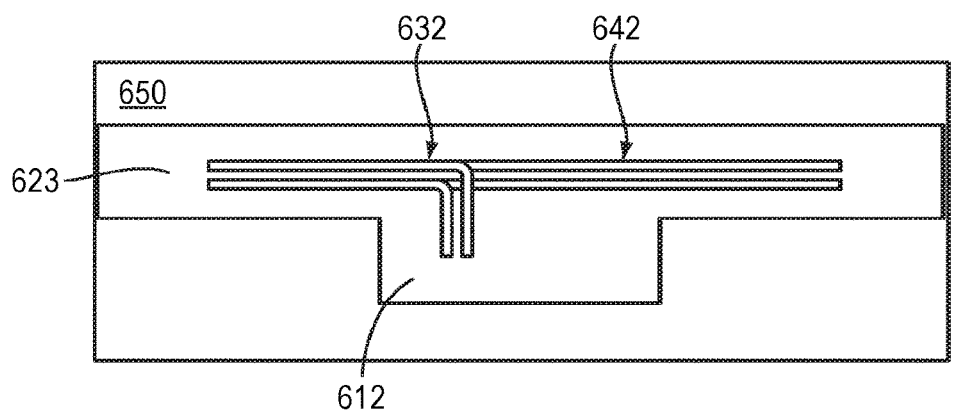
FIG. 6c is a simplified illustration of a pouch off a seam, where the conductive elements exit the seam into the pouch and conductive elements continues down the seam, in accordance with an embodiment of the current disclosure.

The example embodiment of FIG. 6c illustrates conductive network portions 632 and 642 m seam 623 and the conductive elements which they contain terminate in pouch 612, and conductive network portions 632 and 642 are incorporated into fabric 650 seam 623. In some embodiments, conductive elements, such as the conductive elements enclosed by conductive network portion 632 and 642 of FIG. 6c, may be continuous and may enter a pouch, such as pouch 612, by conductor taps which may be connected to a device in a pouch.

Figure 7:
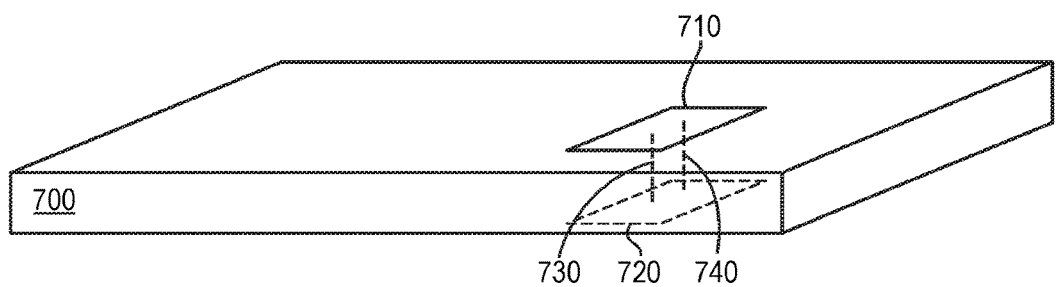
FIG. 7 is a simplified illustration of a conductive elements going through a fabric, in accordance with an embodiment of the current disclosure.

Refer now to the example embodiment of FIG. 7 which illustrates a conductive network comprised of conductive elements 730 and 740 which terminate in pouch 710 on the top of parachute fabric 700 and pouch 720 on the bottom side of parachute fabric 700. In some embodiments there may be more than two conductive elements. In some embodiments, conductors, such as conductive elements 730 and 740 of FIG. 7, may be enclosed in a Faraday cage. In some embodiments, pouches, such as pouches 710 and 720 of FIG. 7, may be non-conductive material. In other embodiments, pouches, such as pouches 710 and 720 of FIG. 7, may be or have conductive material. In certain embodiments, pouches, such as pouches 710 and 720 of FIG. 7, may be sewn to a fabric, such as fabric 700 of FIG. 7. In some embodiments, pouches, such as pouches 710 and 720 of FIG. 7, may be glued to a fabric, such as fabric 700 of FIG. 7. In some embodiments, a conductive network, such as conductive network including conductive elements 730 and 740 of FIG. 7, may go through a seam. In certain embodiments, a conductive network, such as conductive network of FIG. 7 which includes conductive elements 730 and 740, may pass through a fabric, such as fabric 700 of FIG. 7, between stitches of the fabric seam. In some embodiments, a conductive network, such as conductive network which includes conductive elements 730 and 740 of FIG. 7, may pass through a fabric weave.

Figure 8A:
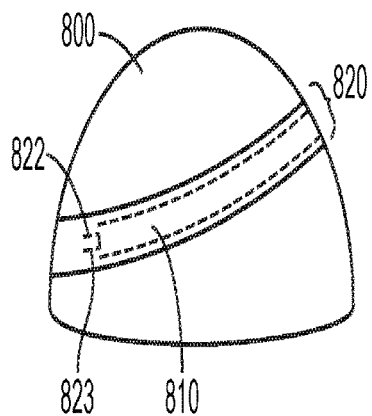
FIG. 8a is a simplified illustration of conductive elements going through a seam in a parachute, in accordance with an embodiment of the current disclosure.
Figure 8B:
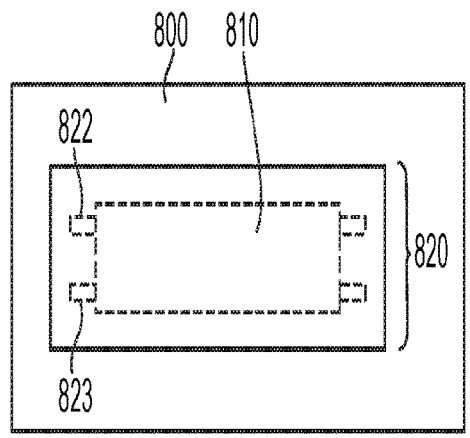
FIG. 8b is an alternative simplified illustration of conductive elements through a seam in a parachute, in accordance with an embodiment of the current disclosure.

Refer now to the example embodiments of FIGS. 8a and 8b, which illustrate a parachute with conductive elements running through a seam. In the example embodiments of FIG. 8a, conductive network 810 is running through seam 820 on parachute 800. FIG. 8a illustrates a conductive network 810 with two conductive elements 822 and 823 inserted in a seam 820 on parachute canopy fabric 800. In many embodiments, conductive elements 822 and 823 may represent multiple conductive elements. In certain embodiments, conductive element 822 and 823 may represent multiple conductive elements enclosed in a conductive fabric. FIG. 8b represents a close-up of a particular embodiment of a conductive network 810 with conductive elements represented by conductive elements 822 and 823 in seam 820 of parachute fabric 800.

Figure 8C:
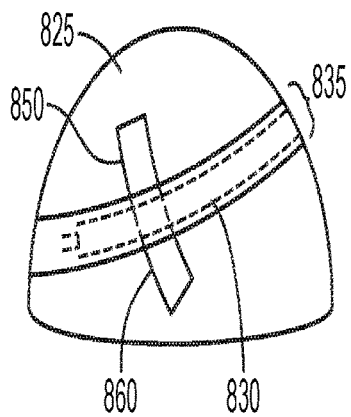
FIG. 8c is a simplified illustration of a conductive elements across a seam in a parachute, in accordance with an embodiment of the current disclosure.
Figure 8D:
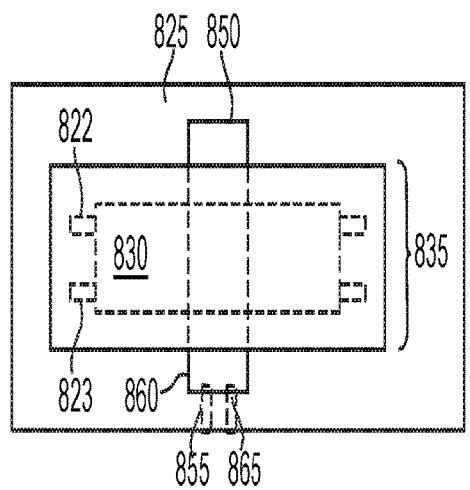
FIG. 8d is an alternative simplified illustration of a conductive elements across a seam in a parachute, in accordance with an embodiment of the current disclosure.

Refer now to the example embodiments of FIGS. 8c and 8d, which represent a conductive network crossing a seam. In FIG. 8c, conductive network with segments 850 and 860 crosses seam 835 on parachute 825. FIG. 8c illustrates a conductive network 830 in a seam 835 on parachute canopy fabric 825 with conductive network branch networks 850 and 860. FIG. 8d represents two conductive elements, conductive elements 855 and 865, of branch networks 850 and 860 crossing seam 835 of parachute 825. FIG. 8d illustrates the conductive network branching from the conductive network 830 in the seam 835 and exiting the seam as conductive networks 850 and 860. For clarity, the example embodiment, of FIGS. 8c and 8d include the conductive elements in seam 820 of FIGS. 8a and 8b.

In some embodiments, there may be more than two conductors inserted in a seam. In some embodiments, a conductive network may be enclosed in a Faraday cage. In certain embodiments, a conductive network may comprise unshielded conductors.

Figure 9A:
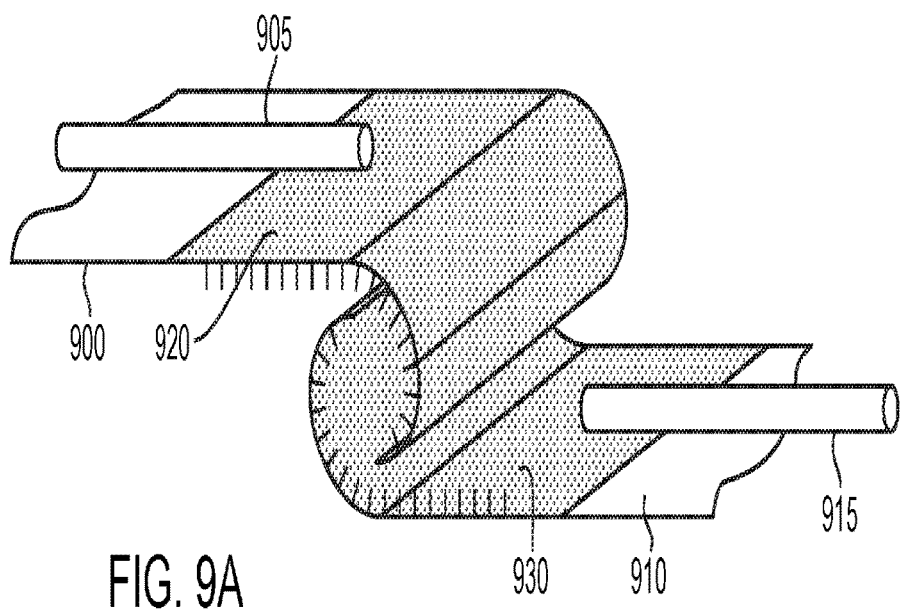
FIG. 9a is a simplified illustration of parachute fabric or material with a seam and stitches and conductive fabric folded into the seam from both joining pieces of fabric, protruding from the seam, providing continuity across the seam and provides a pad for conductor attachment, in accordance with an embodiment of the current disclosure.
Figure 9B:
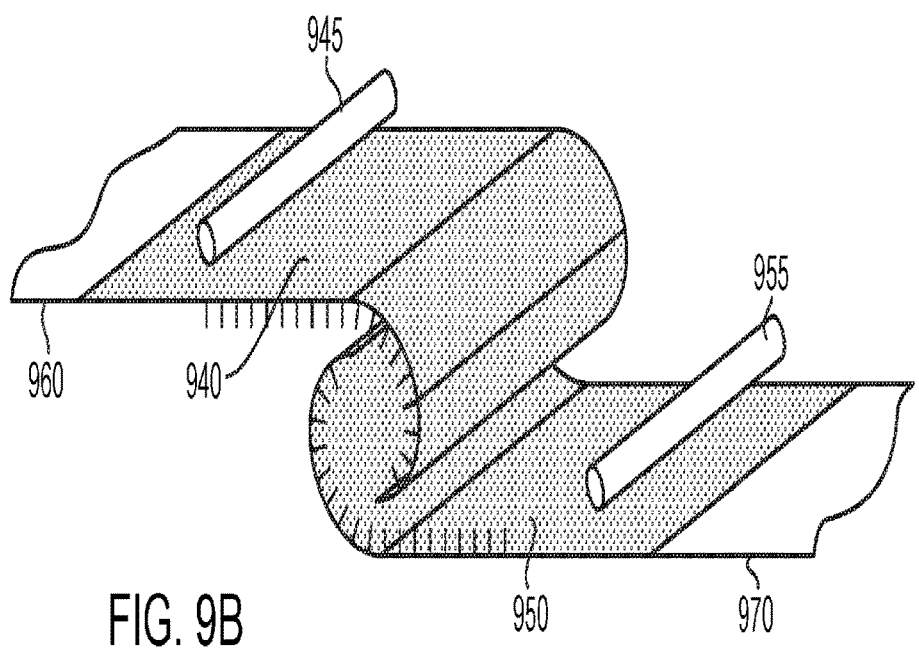
FIG. 9b is a simplified illustration of parachute fabric or material with a seam and stitches and conductive fabric folded into the seam from both joining pieces of fabric, running across the seam, in accordance with an embodiment of the current disclosure.

Refer now to the example embodiments of FIGS. 9a and 9b which illustrate a conductive network translating a seam. FIG. 9 is a simplified illustration of parachute fabric 900 and 910 or material with a seam and stitches and conductive fabric 920 and 930 folded into the seam from both joining pieces of fabric, protruding from the seam, providing continuity across the seam and provides a pad for conductor 905 and 915 attachment in accordance with an embodiment of the current disclosure; FIG. 9a illustrates the conductors 905 and 915 attached parallel to the conductive fabric 920 and 930.

In some embodiments, conductors, such as conductors 905 and 915 of FIG. 9a, may be attached to a conductive fabric, such as conductive fabric 920 and 930 of FIG. 9a, by conductive thread. In some embodiments, conductors, such as conductors 905 and 915 of FIG. 9a, may be attached to conductive fabric, such as conductive fabric 920 and 930 of FIG. 9a, by conductive epoxy. In some embodiments, conductors, such as conductors 905 and 915 of FIG. 9a, may be attached to a conductive fabric, such as conductive fabric 920 and 930 of FIG. 9a, by solder.

FIG. 9b illustrates the conductors 945 and 955 attached perpendicular to the conductive fabric 940 and 950. In some embodiments, the conductors 945 and 955 are attached to the conductive fabric 940 and 950 by conductive thread. In some embodiments, the conductors 945 and 955 are attached to the conductive fabric 940 and 950 by conductive epoxy. In some embodiments, conductors, such as conductors 945 and 955 of FIG. 9b, may be attached to a conductive fabric, such as conductive fabric 940 and 950 of FIG. 9b, by solder.

Figure 10:
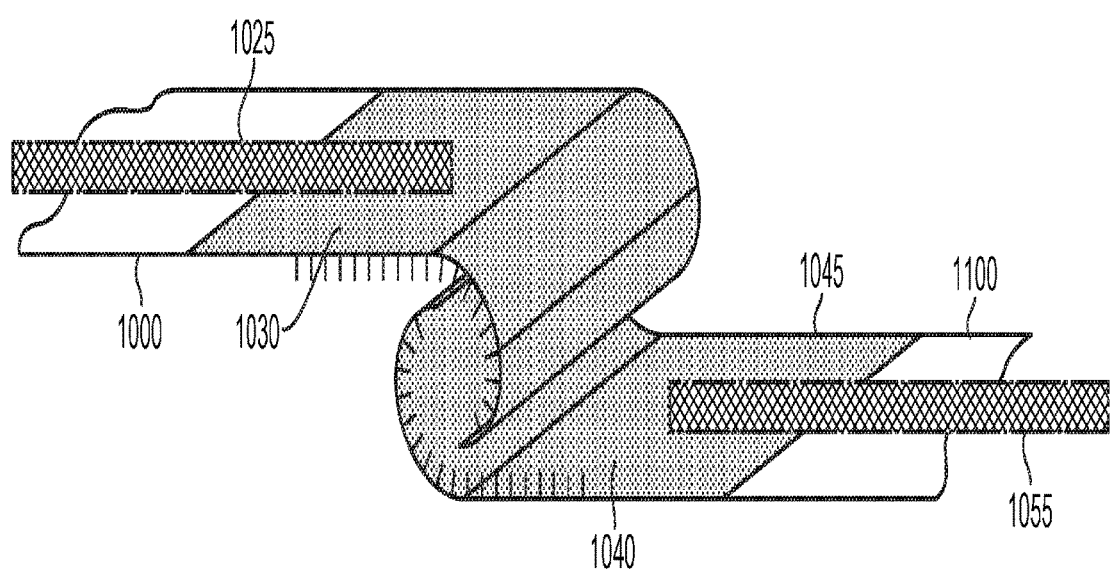
FIG. 10 is a simplified illustration of parachute fabric or material with a seam and stitches and conductive fabric folded into the seam from both joining pieces of fabric, protruding from the seam and providing continuity across the seam, in accordance with an embodiment of the current disclosure.

Refer now to the example embodiment of FIG. 10, which illustrates a conductive network translating a seam. FIG. 10 is a simplified illustration of parachute fabric 1000 or material and parachute fabric 1100 or material with a seam and stitches and conductive fabric 1030 and 1040 folded into the seam from both joining pieces of fabric 1000 and 1100. FIG. 10 illustrates the conductive fabric 1030 and 1040 protruding from the seam and providing continuity across the seam. FIG. 10 illustrates conductive material or conductive fabric 1025 and 1055 covering a conductive elements, such as show in FIG. 9a or 9b, attached to the conductive fabric 1030 and 1040. In some embodiments, conductors may be attached to conductive fabrics, such as conductive fabrics 1000 and 1100 of FIG. 10, by a conductive thread. In some embodiments, conductors may be attached to a conductive fabric, such as conductive fabrics 1030 and 1040 of FIG. 10, by a conductive epoxy. In some embodiments, conductors may be attached to conductive fabric, such as conductive fabrics 1030 and 1040 of FIG. 10, by solder.

Figure 11:
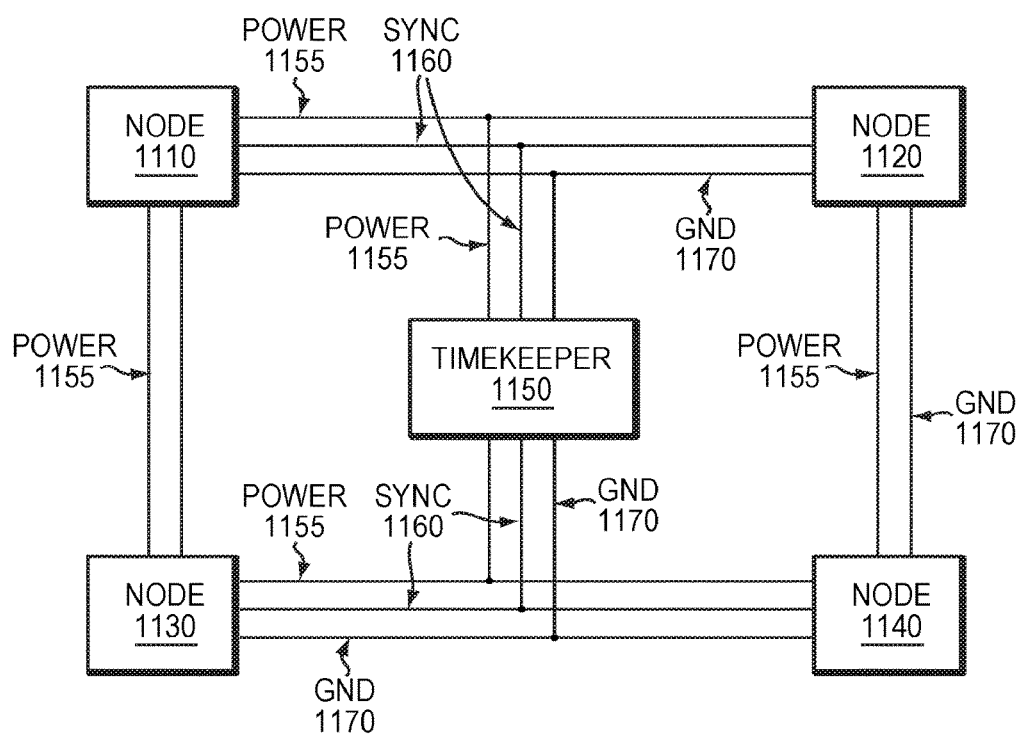
FIG. 11 a simplified illustration a data collection network, m accordance with an embodiment of the current disclosure.

Refer now to the example embodiment of FIG. 11, which illustrates a network configuration. FIG. 11 which illustrates a power and interconnections with network nodes and synchronization with a master clock, timekeeper. In FIG. 11, there are nodes 1110, 1120, 1130, and 1140. As well there is timekeeper 1150. Nodes 1110, 1120, 1130, and 1140 and timekeeper 1150 are connected by ground 1170, power 1155. Nodes 1120 and 1110 are also connected with sync 1160 to each other and timekeeper 1150. Nodes 1130 and 1140 are also connected with sync 1160 to each other and timekeeper 1150. In some embodiments, nodes may represent one or more different sensors.

Figure 12:
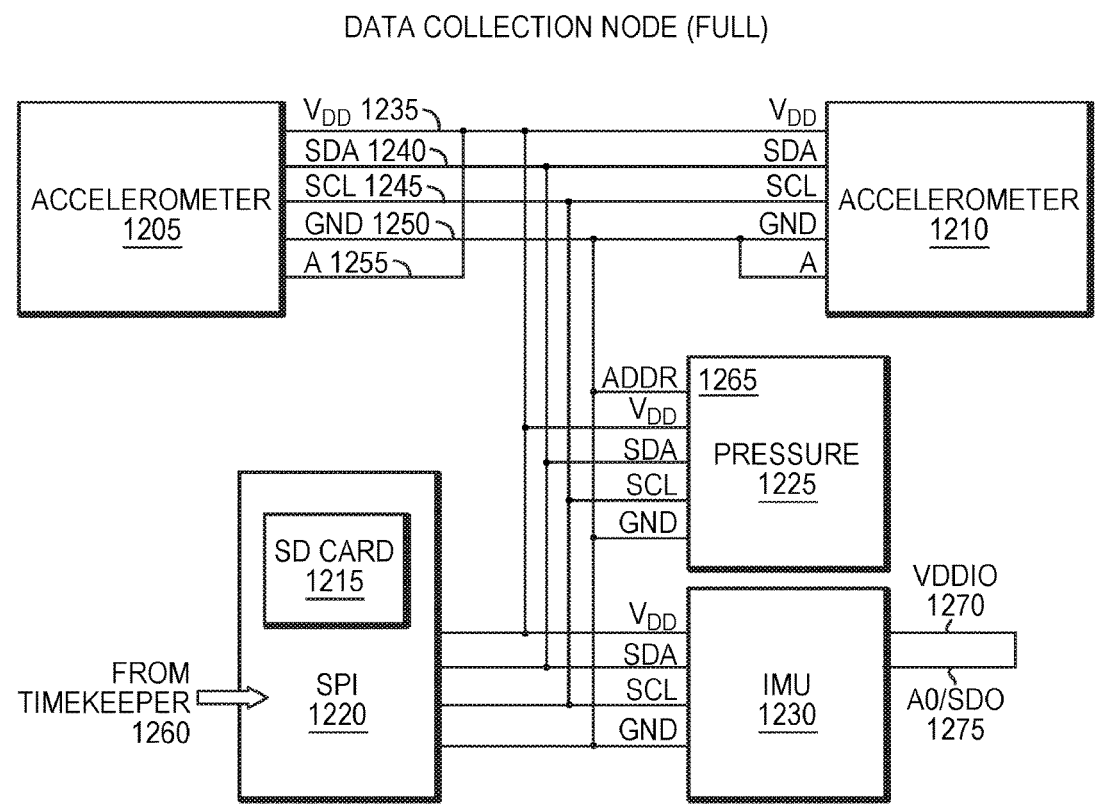
FIG. 12 an alternative simplified illustration a data collection network, in accordance with an embodiment of the current disclosure.

Refer now to the example embodiment of FIG. 12 which illustrates I²C conductive network with a microprocessor and sensors. In the example embodiment of FIG. 12, there is accelerometer 1205, accelerometer 1210, SPI 1220 with SD Card 1215, Pressure sensor 1225, IMU 1340, and interconnects, Vdd 1235, SDA 1240, SCL 1245, Ground 1250, A 1255, as well as from timekeeper 1260 (clock), VDDIO 1270, and AO/DO 1275.

In some embodiments devices of a conductive network may be physically located near each other. In some embodiments the devices may be distributed over the area of the parachute canopy. In some embodiments the conductive network and sensors may be located on the top surface of a canopy. In some embodiments a conductive network and sensors may be located on the bottom surface of a canopy. In some embodiments conductive network and sensors may be located on a structural surface of a canopy.

Figure 13:
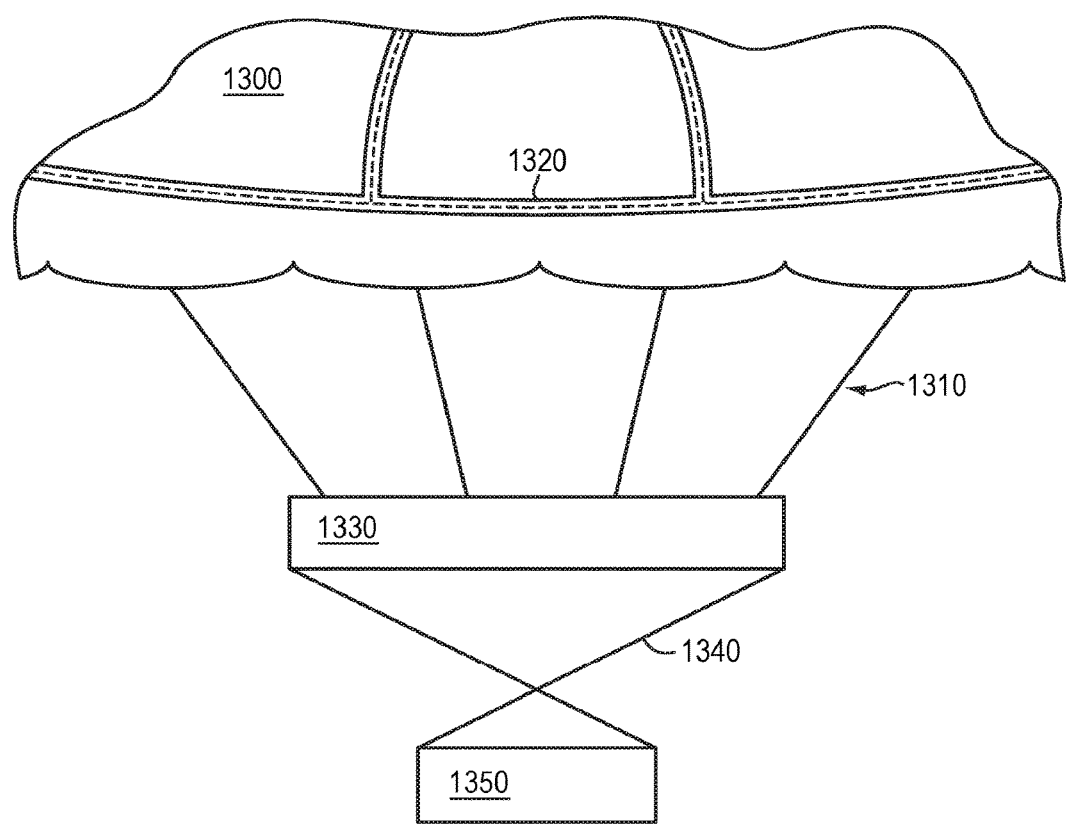
FIG. 13 a simplified illustration a parachute, in accordance with an embodiment of the current disclosure.

Refer now to the example embodiment of FIG. 13 which illustrates a conductive network covered by fabric 1320 on parachute 1300. FIG. 13 illustrates the parachute lines 1310 connected to a parachute steering/control system 1330. FIG. 13 illustrates parachute control system strapped by straps 1340 to payload 1350. In some embodiments, a conductive network may be connected to a battery or a processor or a memory device on the control system. In some embodiments, a conductive network may be connected to a battery or a processor or a memory device on the payload.

Figure 14A:
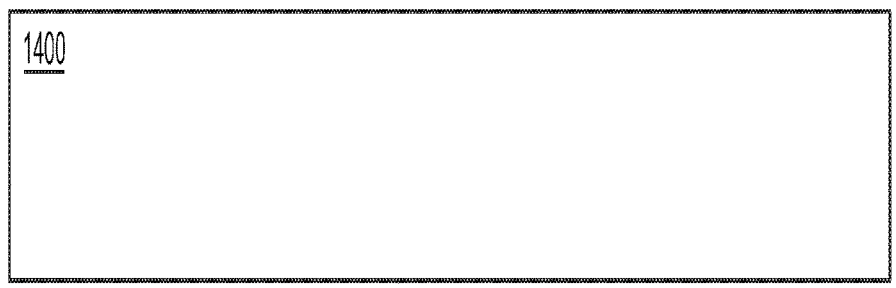
FIG. 14a is a simplified illustration of a parachute, in accordance with an embodiment of the current disclosure.
Figure 14B:
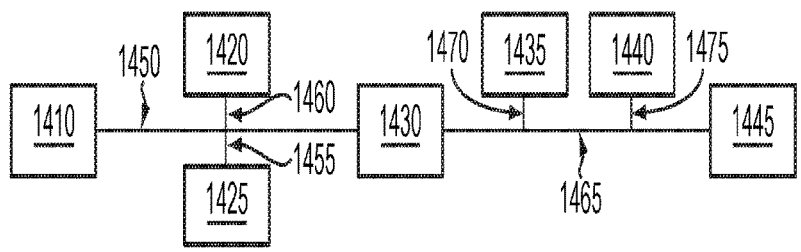
FIG. 14b is a simplified illustration of a conductive network, in accordance with an embodiment of the current disclosure.

Refer now to the example embodiments of FIGS. 14a and 14b, which illustrate a parachute and a conductive network. The example embodiment of FIG. 14a represents a parachute fabric 1400. FIG. 14b illustrates a conductive network. Conductive network has devices 1410, 1420, 1425, 1430, 1435, 1440, and 1445. Conductive network has conductive elements 1450, 1455, 1460, 1470, 1465, and 1475. In some embodiments, each of the conductive elements may contain more than one conductive element. In many embodiments, when each conductive element represents many conductive elements, the conductive elements may be separated by a conductive fabric, such as those of FIGS. 3a and 3b. In many embodiments, when each conductive element represents many conductive elements, the conductive elements may be enclosed in a Faraday cage.

Figure 14C:
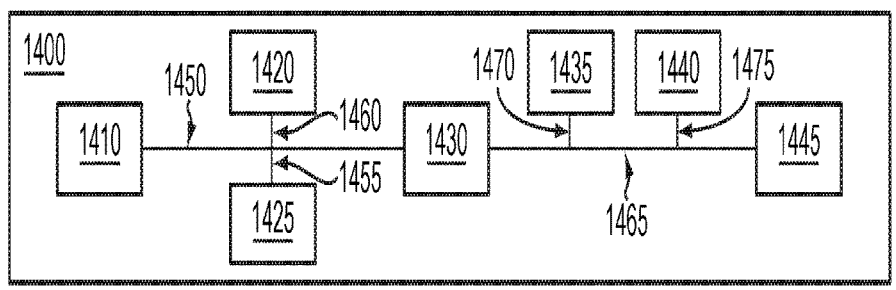
FIG. 14c is a simplified illustration of a conductive network on a parachute, in accordance with an embodiment of the current disclosure.
Figure 14D:
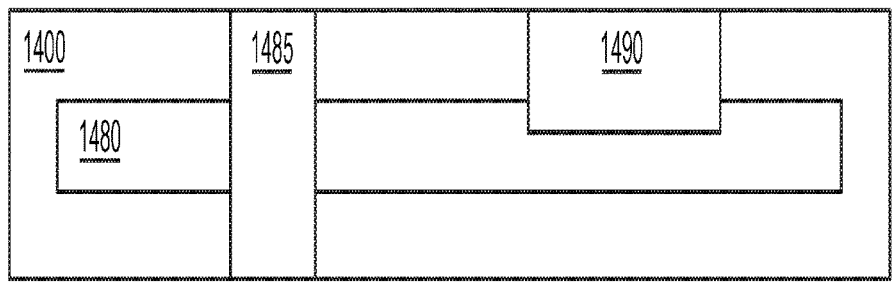
FIG. 14d is a simplified illustration of a conductive network on a parachute, where the conductive network is covered by a conductive material, in accordance with an embodiment of the current disclosure.

Refer now to the example embodiment of FIG. 14c, which represents a conductive network placed on a parachute. In FIG. 14c, the conductive network of FIG. 14b has been attached to parachute fabric 1400. Refer now to the example embodiment of FIG. 14d, which illustrates a covering over a conductive network on a parachute. In this example embodiment, conductive materials 1480, 1485, and 1490 are placed over the conductive network on the parachute and attached to parachute 1400. In some embodiments, a conductive network may be shielded and covered by non-conductive fabric; such an alternative embodiment may appear similar to FIG. 14D where fabrics 1480, 1485 and 1490 of FIG. 14d are be non-conductive.

Figure 15A:
FIG. 15a is a simplified illustration of a parachute, in accordance with an embodiment of the current disclosure.
Figure 15B:
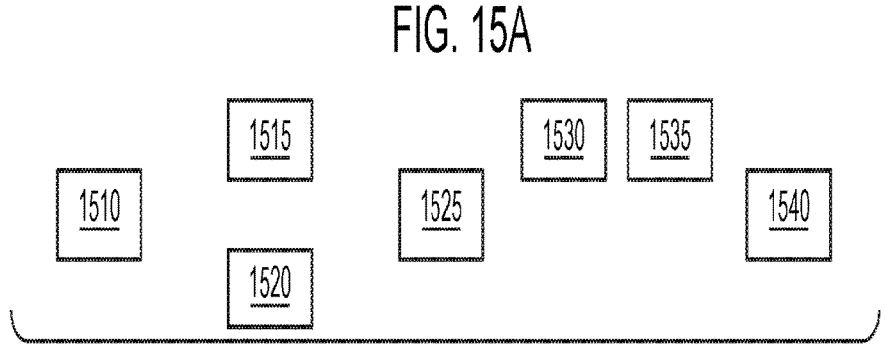
FIG. 15b is a simplified illustration of sensors m network, m accordance with an embodiment of the current disclosure.

Refer now to the example embodiments of FIGS. 15a and 15b, which illustrate a parachute fabric surface, a parachute seam and a conductive network. The example embodiment of FIG. 15a illustrates parachute fabric 1500 with conductive element 1502 inside of seam 1503. The example embodiment of FIG. 15b illustrates sensors 1510, 1515, 1520, 1525, 1530, 1535, and 1540, that when combined with conductive element 1502 form a conductive network. The example embodiment of 15c illustrates the sensors of FIG.

15b connected to conductive element 1502, further connected with conductive elements 1555, 1560, 1565 and 1570 to form a conductive network.

Figure 15C:
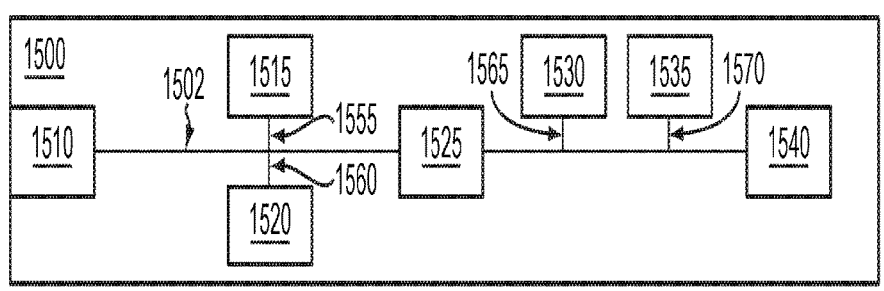
FIG. 15c is a simplified illustration of a conductive network on a parachute with conductive elements in the seam of the parachute, in accordance with an embodiment of the current disclosure.
Figure 15D:
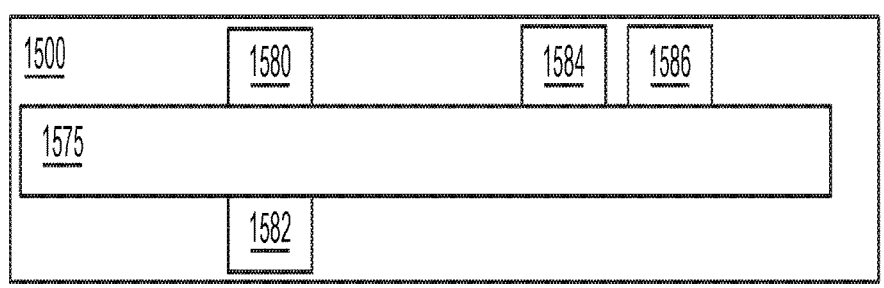
FIG. 15d is a simplified illustration of a conductive network on a parachute, where the conductive network is covered by a conductive material, in accordance with an embodiment of the current disclosure.

The example embodiment of FIG. 15d illustrates the conductive network of FIG. 15c covered by conductive material 1575, 1580, 1582, 1584, and 1586. Conductive material 1575, 1580, 1582, 1584, and 1586 form a Faraday cage for sensors 1510, 1515, 1520, 1525, 1530, 1535, and 1540. In certain embodiments, conductive material, such as conductive material 1580, 1582, 1584, 1575, and 1586 of FIG. 15c may form pouches for sensors 1510, 1515, 1520, 1525, 1530, 1535, and 1540. In some embodiments, each of the conductive elements may contain more than one conductive element. In many embodiments, when each conductive elements represents many conductive elements, the conductive elements may be separated by a conductive fabric, such as those of FIGS. 3a and 3b. In many embodiments, when each conductive elements represents many conductive elements, the conductive elements may be enclosed in a Faraday cage.

Figure 16A:
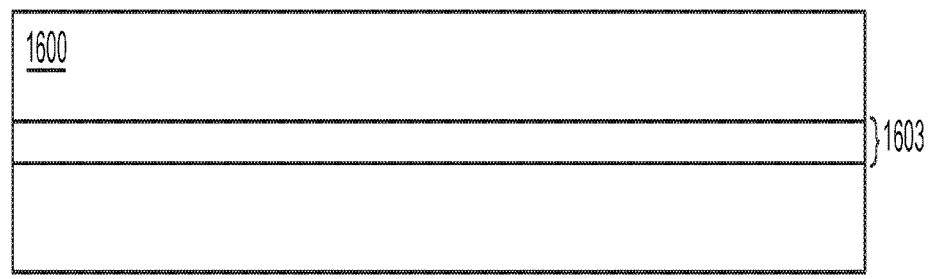
FIG. 16a is a simplified illustration of a parachute, in accordance with an embodiment of the current disclosure.
Figure 16B:
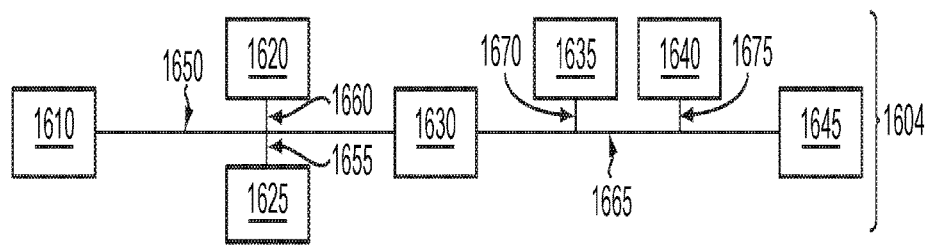
FIG. 16b is a simplified illustration of a conductive network, in accordance with an embodiment of the current disclosure.

Refer now to the example embodiments of FIGS. 16a, 16b, 16c, and 16d, which illustrates a conductive network inserted into a seam of a parachute. Refer now to the example embodiment of FIGS. 16a and 16b, which illustrate a parachute fabric surface, a parachute seam 1603 and a conductive network of FIG. 16b. The example embodiment of FIG. 16a represents a parachute fabric 1600 and parachute seam 1603. FIG. 16a illustrates parachute 1600 with seam 1603. FIG. 16b illustrates a conductive network. Conductive network has device pouches 1610, 1620, 1625, 1630, 1635, 1640, and 1645. FIG. 16b represents conductive network 1604, which has sensors inside of pouches 1610, 1620, 1625, 1630, 1635, 1640, and 1645. Conductive network 1604 has conductive elements 1650, 1655, 1660, 1670, 1665, and 1675. In some embodiments, each of the conductive elements may contain more than one conductive element. In many embodiments, when each conductive elements represents many conductive elements, the conductive elements may be separated by a conductive fabric, such as those of FIGS. 3a and 3b. In many embodiments, when each conductive elements represents many conductive elements, the conductive elements may be enclosed in a Faraday cage. In certain embodiments, conductive fabric may be pre-attached to a parachute or fabric and sensors may be inserted into the pouches and connected to conductive elements to form a conductive network.

Figure 16C:
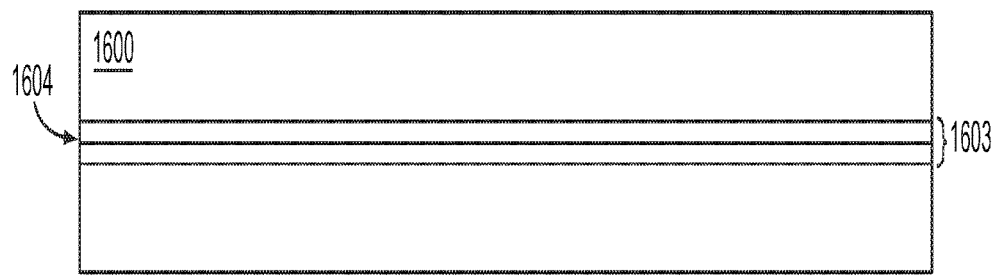
FIG. 16c is a simplified illustration of the conductive network of FIG. 16b threaded through the seam of FIG. 16a of the parachute of FIG. 16a, in accordance with an embodiment of the current disclosure.
Figure 16D:
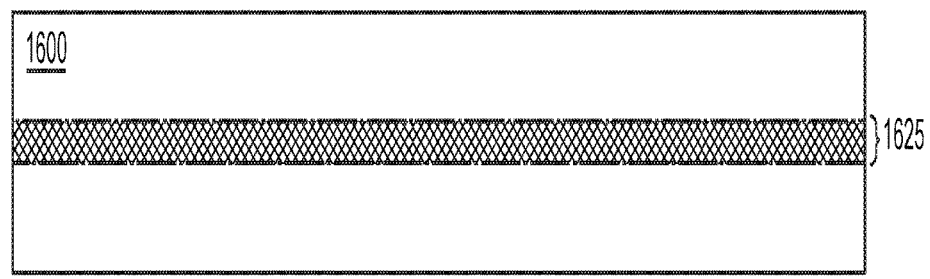
FIG. 16d is a simplified illustration of a conductive network on a parachute, where the conductive network is covered by a conductive material to form a Faraday cage, in accordance with an embodiment of the current disclosure.

Refer now to the example embodiment of FIG. 16c. In the example embodiment of FIG. 16c, conductive network 1604 has been inserted into seam 1603. Refer now to the example embodiment of FIG. 16d, which illustrates a conductive material 1625 placed over seam 1603, which contains conductive network 1604. In some embodiments, pouches may be inserted into a seam of a parachute to cover sensors in a conductive network inserted into a seam. In other embodiments, conductive elements may exit a seam into pouches outside of a seam.

Figure 17A:
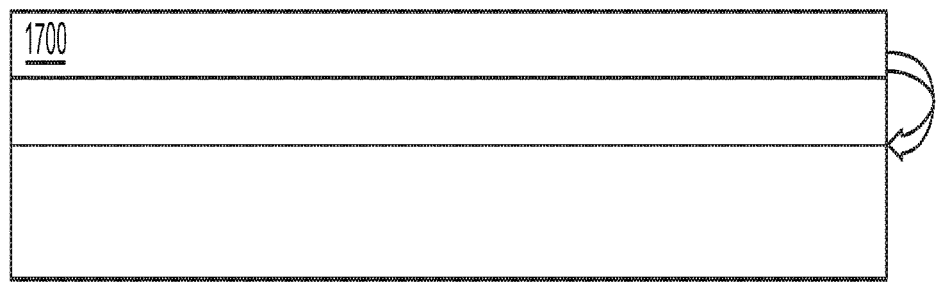
FIG. 17a is a simplified illustration of a parachute, in accordance with an embodiment of the current disclosure.
Figure 17B:
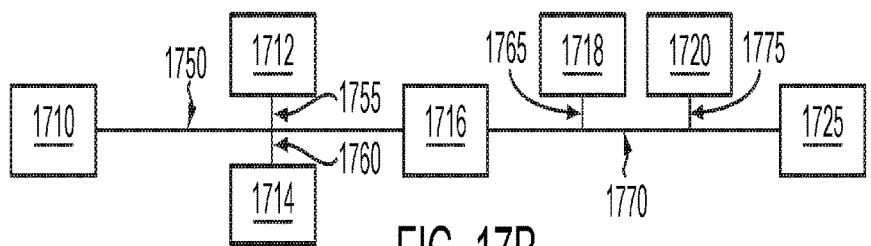
FIG. 17b is a simplified illustration of a conductive network, in accordance with an embodiment of the current disclosure.
Figure 17C:
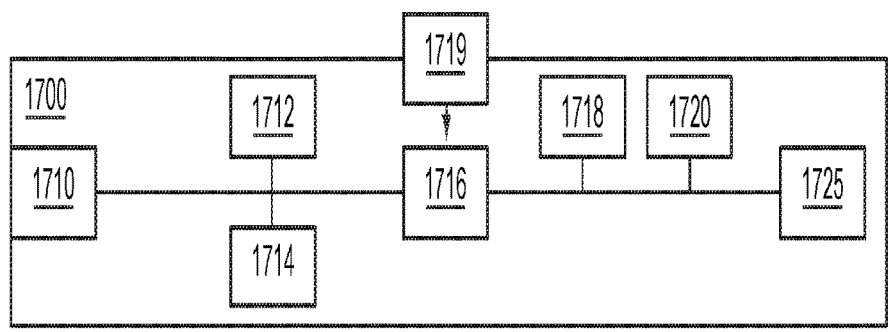
FIG. 17c is a simplified illustration of a conductive network on a parachute, in accordance with an embodiment of the current disclosure.
Figure 17D:
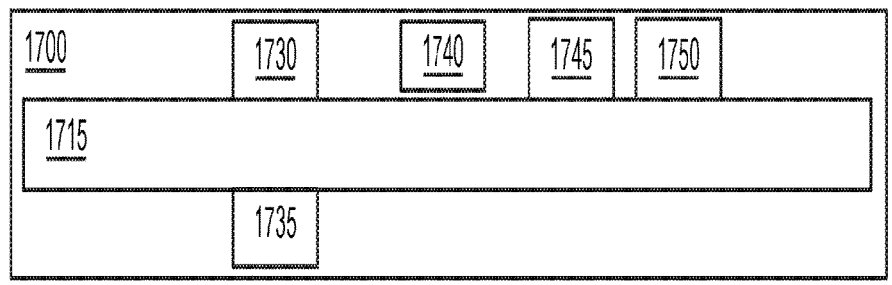
FIG. 17d is a simplified illustration of a conductive network on a parachute, where the conductive network is covered by a conductive material to form a Faraday cage, in accordance with an embodiment of the current disclosure.

Refer now to the example embodiments of FIGS. 17a and 17b, which illustrate a parachute fabric interior bottom surface and a conductive network. The example embodiment of FIG. 17a represents a parachute fabric 1700. FIG. 17b illustrates a conductive network. The conductive network has device pouches 1710, 1712, 1714, 1716, 1718, 1720, and 1725. Conductive network has conductive elements 1750, 1755, 1760, 1770, 1765, and 1775. In some embodiments, each of the conductive elements may contain more than one conductive element. In many embodiments, when each conductive element represents many conductive elements, the conductive elements may be separated by a conductive fabric, such as those of FIGS. 3a and 3b. In many embodiments, when each conductive element represents many conductive elements, the conductive elements may be enclosed in a Faraday cage. In certain embodiments, conductive fabric may be pre-attached to a parachute or fabric and sensors may be inserted into the pouches and connected to conductive elements to form a conductive network.

Refer now to the example embodiments of FIGS. 17a, 17b, 17c, and 17d, which illustrates a conductive network attached to an interior surface of a parachute. FIG. 17a illustrates parachute 1700. FIG. 17b represents conductive network 1704, which has device pouches 1710, 1720, 1725, 1730, 1735, 1740, and sensor 1745. Conductive network 1704 contain conductive elements 1750, 1760, 1755, 1770, 1775, and 1765. Refer now to the example embodiment of FIG. 17c. In the example embodiment of FIG. 17c, conductive network 1704 has been placed on parachute fabric 1700. Refer now to the example embodiment of FIG. 17d, which illustrates a conductive material placed over conductive network. In some embodiments sensors are placed in the pouches and connected to the conductive network. In certain embodiments, a coil of conductive element may offer release against strain. In many embodiments, a coil of conductive element or elements may be located in a pouch. In other embodiments, a coil of conductive element may be located in a seam.

What is claimed is:

1. A system comprising:
   a conductive network; wherein the conductive network includes a set of flexible conductive elements; wherein the set includes a first flexible conductive element; wherein at least a portion of the first flexible conductive element is enclosed within an insulator; and
   one or more Faraday cages, wherein the one or more Faraday cages are configured to be arranged to shield at least a portion of the conductive network; wherein the one or more Faraday cages and conductive network are configured to integrate with a parachute to enable the conductive network and parachute to be packed, deployed, and recovered without damaging the parachute, one or more Faraday cages, or conductive network.

2. The system of claim 1 wherein the one or more conductive fabrics are combined with the parachute.

3. The system of claim 1 wherein the conductive network and the one or more Faraday cages are enabled to withstand 3 Gs applied to the parachute.

4. The system of claim 1 wherein flexible conductive elements of the set of flexible conductive elements are conductive threads.

5. The system of claim 1 wherein the conductive network and the one or more Faraday cages are capable of withstanding a static charge buildup of nominally 25,000 volts.

6. The system of claim 1 wherein the conductive network maintains an insulation surface temperature of 165° F. or less when conducting up to 6 amperes of current; and wherein the one or more Faraday cages and conductive network are enabled to survives multiple parachute drops and high shock impacts.

7. The system of claim 1 wherein the conductive network forms an interconnection network to connect electromechanical, microcontrollers, memory devices, sensor and other electronic devices.

8. The system of claim 1 wherein conductive elements of the conductive network are comprised of metalized threads of non-metallic, insulating fibers.

9. An apparatus comprising:
a conductive network; wherein the conductive network includes a set of flexible conductive elements; wherein the set includes a first flexible conductive element; wherein at least a portion of the first flexible conductive element is enclosed within an insulator; and
one or more Faraday cages, wherein the one or more Faraday cages are configured to be arranged to shield at least a portion of the conductive network; wherein the one or more Faraday cages and conductive network are configured to integrate with a parachute to enable the conductive network and parachute to be packed, deployed, and recovered without damaging the parachute, one or more Faraday cages, or conductive network.

10. The apparatus of claim 8 wherein flexible conductive elements of the set of flexible conductive elements are conductive threads.

11. The apparatus of claim 9 wherein conductive elements of the conductive network are comprised of metalized threads of non-metallic, insulating fibers.

12. The apparatus of claim 9 wherein the conductive network and the one or more Faraday cages are capable of withstanding a static charge buildup of nominally 25,000 volts.

13. A method comprising:
arranging one or more Faraday cages to at least partially shield a conductive network; wherein the conductive network includes a set of flexible conductive elements; wherein the set includes a first flexible conductive element; wherein at least a portion of the first flexible conductive element is enclosed within an insulator; wherein the one or more flexible Faraday cages and conductive network are configured to integrate with a parachute to enable the conductive network and parachute to be packed, deployed, and recovered without damaging the parachute, one or more Faraday cages or conductive network.

14. The method of claim 13 further comprising, combining the one or more flexible Faraday cages and conductive network to the parachute.

15. The method of claim 13 wherein the conductive network and the one or more Faraday cages are enabled to withstand 3 Gs applied to the parachute.

16. The method of claim 13 wherein flexible conductive elements of the set of flexible conductive elements are conductive threads.

17. The method of claim 13 wherein the conductive network and the one or more flexible Faraday cages are capable of withstanding a static charge buildup of nominally 25,000 volts.

18. The method of claim 13 wherein the conductive network maintains an insulation surface temperature of 165° F. or less when conducting up to 6 amperes of current; and wherein the one or more flexible Faraday cages and conductive network are enabled to survives multiple parachute drops and high shock impacts.

19. The method of claim 13 wherein the conductive network forms an interconnection network to connect electromechanical, microcontrollers, memory devices, sensor and other electronic devices.

20. The method of claim 13 wherein conductive elements of the conductive network are comprised of metalized threads of non-metallic, insulating fibers.

* * * * *